United States Patent [19]
Schädeli et al.

[11] Patent Number: 5,879,855
[45] Date of Patent: *Mar. 9, 1999

[54] COMPOSITIONS FOR MAKING STRUCTURED COLOR IMAGES AND APPLICATION THEREOF

[75] Inventors: Ulrich Schädeli, Plasselb; John S. Zambounis, Murten; Abul Iqbal, Arconciel; Zhimin Hao, Marly, all of Switzerland

[73] Assignee: Ciba Specialty Chemicals Corporation, Tarrytown, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 341,721

[22] Filed: Nov. 18, 1994

[30] Foreign Application Priority Data

Nov. 22, 1993 [EP] European Pat. Off. .............. 93810807

[51] Int. Cl.$^6$ .................................................. G03C 5/00
[52] U.S. Cl. ................. 430/270.1; 430/292; 430/325; 430/326; 430/338; 430/342; 430/346; 430/347; 430/351; 430/955; 430/962; 430/964
[58] Field of Search .................. 430/270.1, 292, 430/325, 326, 338, 955, 346, 347, 351, 342, 962, 964

[56] References Cited

U.S. PATENT DOCUMENTS

| | | | |
|---|---|---|---|
| 4,585,878 | 4/1986 | Jost et al. ................................. | 548/453 |
| 4,666,455 | 5/1987 | Jost et al. ................................. | 8/506 |
| 4,826,976 | 5/1989 | Borror et al. ........................... | 544/58.4 |
| 5,098,738 | 3/1992 | Nakajima et al. ....................... | 427/150 |
| 5,243,052 | 9/1993 | Taylor et al. ............................ | 546/154 |
| 5,254,434 | 10/1993 | Uytterhoeven ......................... | 430/203 |
| 5,268,245 | 12/1993 | Chiulli ...................................... | 430/7 |
| 5,561,232 | 10/1996 | Hao et al. ................................. | 546/14 |
| 5,616,725 | 4/1997 | Zambounis et al. ..................... | 548/453 |

FOREIGN PATENT DOCUMENTS

| | | |
|---|---|---|
| 0380223 | 8/1990 | European Pat. Off. . |
| 0483412 | 5/1992 | European Pat. Off. . |
| 0483693 | 5/1992 | European Pat. Off. . |
| 0535788 | 4/1993 | European Pat. Off. . |
| 4123175 | 4/1992 | Japan . |
| 1386586 | 3/1975 | United Kingdom . |

OTHER PUBLICATIONS

C.A. 104:159686r (1985) equivalent of JP 60,180,889.
Derwent abst. 93–112514/14 (1991) equivalent of JP 5–50757.
Derw. Abst. 93/005193 = JP–A–4,333,850.
Comprehensive Polymer Science, The Synthesis Characterization Reactions & Applications of Polymers, vol. 6, "Photochemical & Radiation Sensitive Resists", p. 193, Turner et al.

*Primary Examiner*—Bernard Codd
*Attorney, Agent, or Firm*—Kevin T. Mansfield; Jacob M. Levine

[57] ABSTRACT

Compositions for making structured color images comprising (a) a soluble pigment precursor which can be transformed to an insoluble pigment by means of chemical, thermal, photolytic or radiation-induced method, and (b) a binder polymer or prepolymer, or a positive or negative resist-type resin which can be structured by crosslinking, polymerization or depolymerization by applying heat or electromagnetic irradiation. The compositions can be applied to optical and thermal recording, printing, and the production of color filters for Liquid Crystal Displays, with high accuracy, high transparency and high stability.

22 Claims, No Drawings

COMPOSITIONS FOR MAKING STRUCTURED COLOR IMAGES AND APPLICATION THEREOF

The present invention relates to novel compositions for making structured color images and applications thereof.

As methods for forming polymer pattern or image layers, there are known various techniques like photolithography, impact printing, such as screen printing, gravure printing, flexo printing and offset printing, non-impact printing, such as ink-jet printing, thermal dye diffusion transfer, laser marking, electrodeposition, etc. In all such imaging and recording methods, the actual coloring material comprises pigments and dyestuffs combined with appropriate resins, binders, polymers and additives.

Such colors are applied, thus, for example, as recording elements of optical memories as disclosed in JP Kokai 05050757 A, as recording elements of thermal recording memories as disclosed in EP-A535788, and as coloring materials for color filters of LCDs (liquid crystal displays) as described in H. Aruga, J. Photopolym. Sci. Technol., 3(1) 9–16(1990), EP-A380223, K. Mizuno et al., Jpn. J. Appl. Phys., Part 1, 30 3313–17(1991) and K. Kobayashi, Solid State Technology, 11(1992)15–18. Polymeric pattern layers may be coloured after crosslinking, for example through thermal dye diffusion transfer with well-known dyes as mentioned in EP-008828.

According to the above literature, pigments and dyestuffs are used in the form of compositions containing pigments or dyestuffs, polymers or prepolymers and optionally other additives, which are subject to image formation in order to achieve recording or form colored patterns. The process usually comprises the polymerization of a prepolymer or the depolymerization of a structurable polymer by applying heat or electromagnetic radiation or the combination thereof, and the subsequent development using appropriate developers; alternatively, pigments or dyestuffs may be applied directly in a selective pattern, for example through non-impact printing.

While dyes in general are deficient in terms of light, heat, solvent and chemical resistance, pigments in such applications show problems related to dispersion and dispersion stability, transparency, profile sharpness of absorption or transmission spectra and/or lack of solubility or diffusibility. Many properties desirable for the dye's or pigment's nice incorporation into critical systems such as colour LCD's are contradictory with such required for high quality applications. Unsatisfactory compromises have thus to be complied with, like in JP Kokai 60180889 where stability is obtained at the cost of low optical reflection density and poor color gamut, and many pigment classes cannot be used at all. The present invention overcomes this problem.

Recent development in imaging and recording technology requires, however, compositions for producing patterns or images with higher transparency (i.e. high light transmittance), especially for color filter of LCDs,
higher contrast ratio,
higher color purity and strength,
higher pattern resolution and precision of image,
no (dye) color mixing,
no clogging of sieves during purification of color/polymer mixtures,
smoothness of image surface,
pinhole free and non-contaminated image layer,
higher registration accuracy,
higher sharpness of image edges,
higher thermal, chemical and light stability, and
ultra thin film characteristics.

It has now been found, surprisingly, that special soluble pigment precursors may be effected by chemical, thermal, photolytical means, by laser and other means of irradiation to undergo in situ generation of insoluble nano-sized pigment particles, and that the compositions containing the above special pigment precursors for structured color patterns and image formation satisfy the aforementioned requirements.

The present invention relates, accordingly, to novel compositions for forming structured color images containing soluble pigment precursors, in which the precursors regenerate insoluble nano-sized pigment particles by the effect of chemical, thermal, photolytical means or by laser and other means, and application thereof to recording and imaging technology, especially to the fabrication of color filters for LCDs.

In one aspect of the present invention, therefore, there are provided novel compositions for making structured color images comprising (a) a soluble pigment precursor which can be transformed to an insoluble pigment by means of chemical-, thermal-, photolytic- or radiation-induced method or a combination thereof; and (b) a positive or negative resist-type resin, polymer or prepolymer which can be structured by polarity changes, crosslinking, polymerization or depolymerization by applying heat or electromagnetic irradiation such as UV-, visible-, electron-, neutron-, laser- or X-ray irradiation or a combination thereof.

The soluble pigment precursor (a) according to the present invention is represented by formula I

wherein x is a number from 1 to 4,

A is the residue of a colorant of the quinacridone-, anthraquinone-, perylene-, indigo-, quinophthalone-, isoindolinone-, isoindoline-, dioxazine-, diketopyrrolopyrrole- or azo series, which is linked to x groups B via N atoms, which nitrogens are part of A and preferably adjacent to or conjugated with a carbonyl group;

B is a group bound to A, represented by formulae

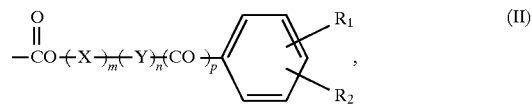

or

and wherein in formulae II, III and IV
m, n and p are each independently of the other 0 or 1,
X is $C_1$–$C_{14}$-alkylene or $C_2$–$C_8$-alkenylene,
Y is a group —T—$(CH2)_q$-,
Z is a group —T—$(CH_2)_r$-,
V is $C_3$–$C_6$-cycloalkylene, q is a number between 1 and 6, r is a number between 0 and 6, $R_1$ and $R_2$ are each independently of the other hydrogen, $C_1$–$C_6$-alkyl, $C_1$–$C_4$-alkoxy, halogen, CN, $NO_2$, phenyl or phenoxy which are unsubstituted or substituted by $C_1$–$C_4$-alkyl, $C_1$–$C_4$-alkoxy or halogen, Q is hydrogen, CN, $Si(R_1)_3$, a group $C(R_5)(R_6)(R_7)$, wherein $R_5$, $R_6$ and $R_7$ are each independently of the other hydrogen or halogen and at least one of the residues $R_5$, $R_6$ and $R_7$ is halogen, a group

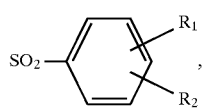

wherein $R_1$ and $R_2$ have the same meaning as given above, a group $SO_2R_8$ or $SR_8$, wherein $R_8$ is $C_1$–$C_4$-alkyl, a group $CH(R_9)_2$, wherein $R_9$ is phenyl which is unsubstituted or substituted by $C_1$–$C_4$-alkyl, $C_1$–$C_4$-alkoxy or halogen, or a group of formula

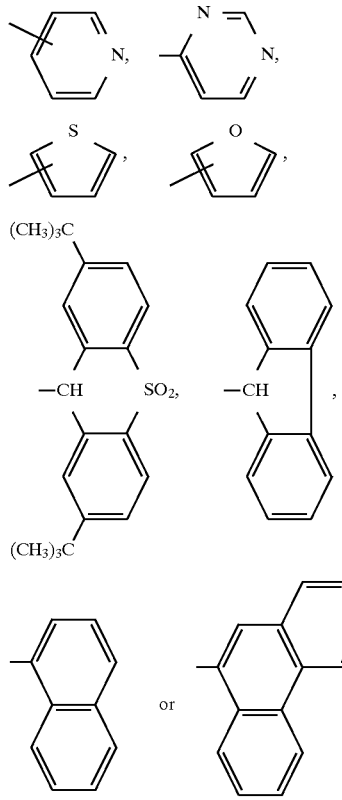

and $R_3$ and $R_4$ are each independently of the other hydrogen, $C_1$–$C_{18}$-alkyl or a group

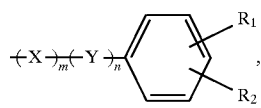

wherein X, Y, $R_1$, $R_2$, m and n have the above given meaning, or $R_3$ and $R_4$ together with the nitrogen, on which they are bound, form a pyrrolidinyl-, piperidinyl- or morpholinyl residue, and wherein $A(B)_x$ may contain additional

=N—, —NH— or —$NH_2$ groups.

It is not necessary, and in many cases not indicated, that all the N atoms are linked to groups B; on the other hand, more than one group B may be linked to a single N atom.

A means a residue of well-known nitrogen containing chromophores, for example,

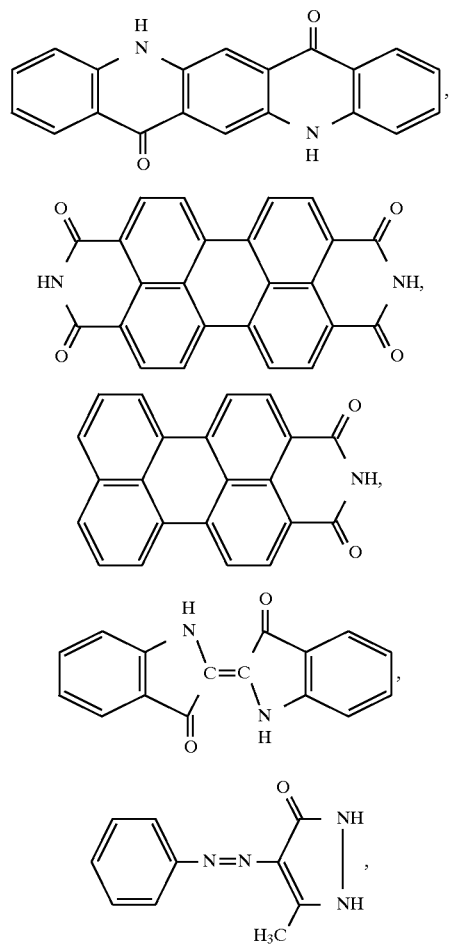

5
-continued
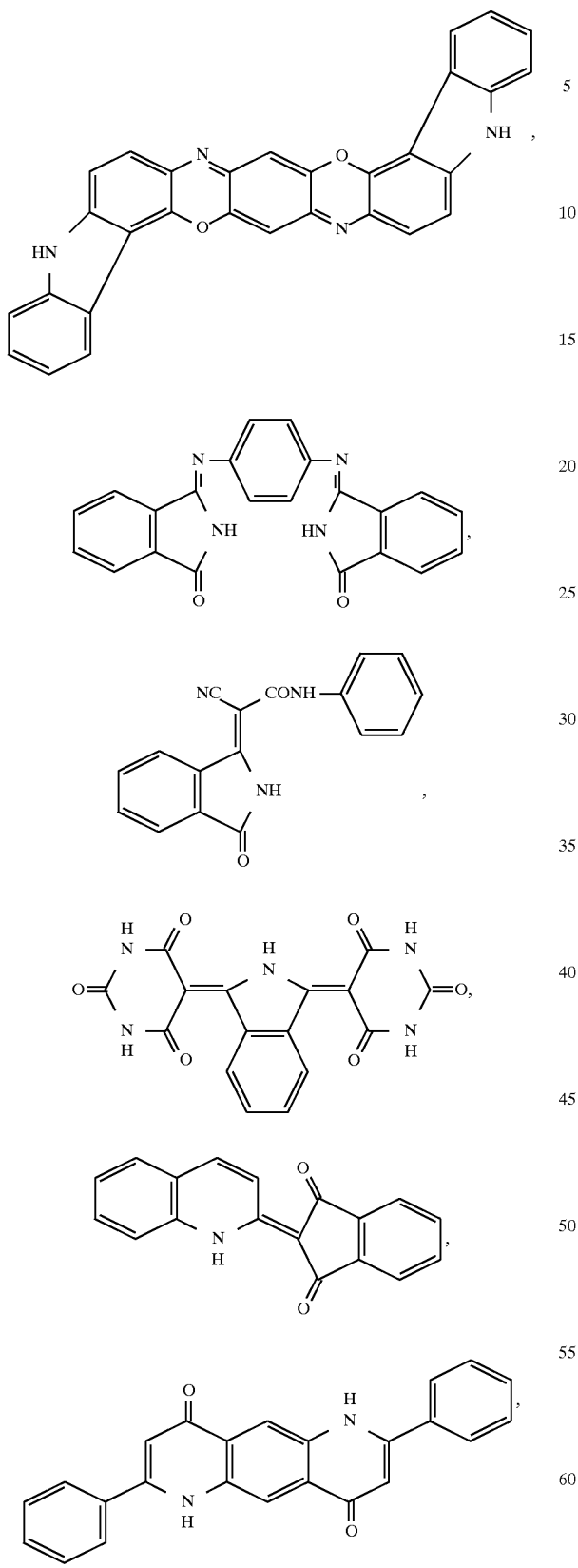
6
-continued
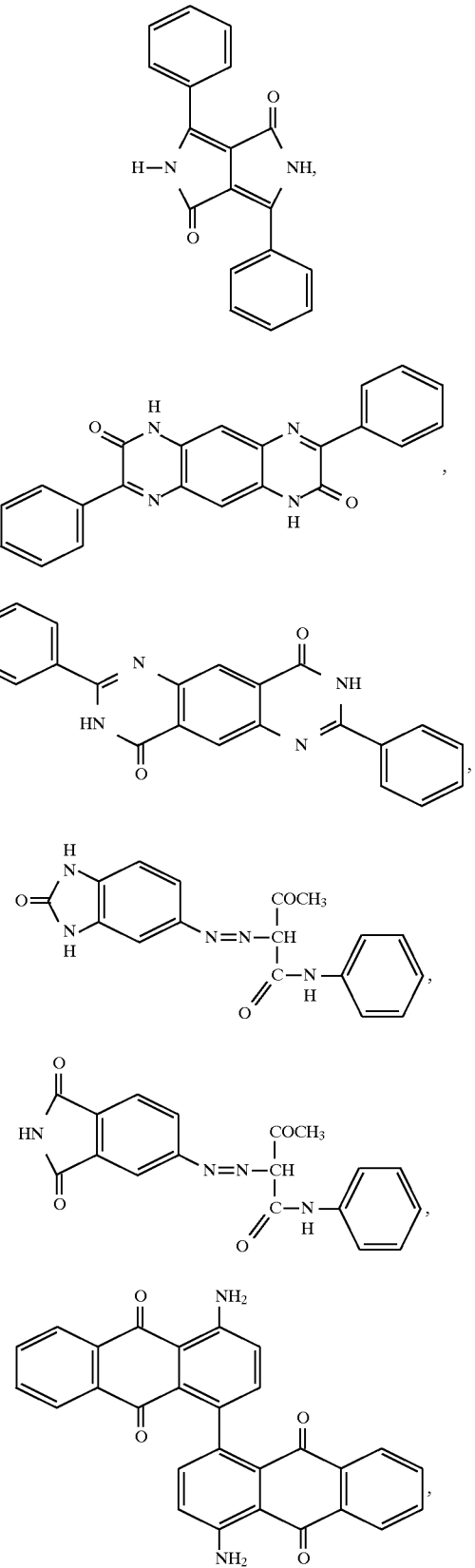

-continued

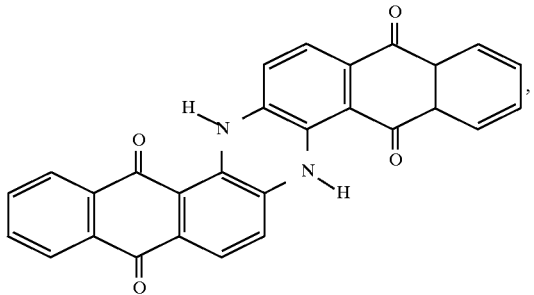

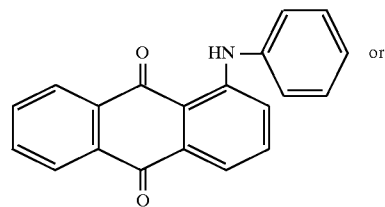

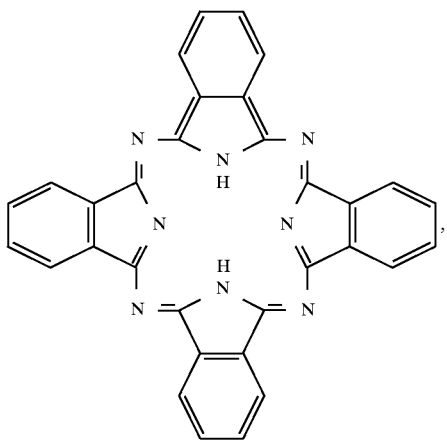

as well as all the known derivatives of such chromophores, respectively.

If X is $C_1$–$C_4$-alkylene, then, it is a straight-chain or branched alkylene, such as methylene, dimethylene, trimethylene, 1-methyl-methylene, 1,1-dimethyl-methylene, 1,1-dimethyl-dimethylene, 1,1-dimethyl-trimethylene, 1-ethyl-dimethylene, 1-ethyl-1-methyl-dimethylene, tetramethylene, 1,1-dimethyl-tetramethylene, 2,2-dimethyl-trimethylene, hexamethylene, decamethylene, 1,1-dimethyl-decamethylene, 1,1-diethyl-decamethylene or tetradecam-ethylene.

X as $C_2$–$C_8$-alkenylene means straight-chain or branched alkylene, such as vinylene, allylene, methallylene, 1-methyl-2-butenylene, 1,1-dimethyl-3-butenylene, 2-butenylene, 2-hexenylene, 3-hexenylene or 2-octenylene.

$C_3$–$C_6$-cycloalkylene means, for example, cyclopropylene, cyclopentylene and, especially, cyclohexylene.

If the substituents are halogen, then, they are, for example, iodo, fluoro, especially bromo, or preferably chloro.

If the substituents are $C_1$–$C_6$-alkyl, then, they are, for example, methyl, ethyl, n-propyl isopropyl, n-butyl, sec-butyl, tert-butyl, n-amyl, tert-amyl or hexyl, and if the substituents are $C_1$–$C_{18}$-alkyl, then, they are additionally, for example, heptyl, octyl, 2-ethylhexyl, nonyl, decyl, dodecyl, tetradecyl, hexadecyl or octadecyl.

$C_1$–$C_4$-alkoxy means, for example, methoxy, ethoxy, n-propoxy, isopropoxy or butoxy.

Of particular interest are compounds of formula I, wherein x is 1 or 2 and B is a group of formula

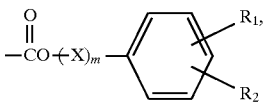

(V)

(VI) or (IV)

and, if x is 2, one of the B residues may also be hydrogen, wherein in formulae IV, V and VI m is 0 or 1, X is $C_1$–$C_4$-alkylene or $C_2$–$C_5$-alkenylene, $R_1$ and $R_2$ are each independently of the other hydrogen, $C_1$–$C_4$-alkyl, methoxy, chloro or $NO_2$, and Q is hydrogen, CN, $CCl_3$, a group

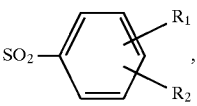

$SO_2CH_3$ or $SCH_3$, and $R_3$ and $R_4$ in formula IV are each independently of the other hydrogen, $C_1$–$C_4$-alkyl or a group

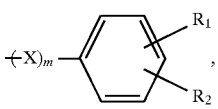

or $R_3$ and $R_4$ form a piperidine residue together with the nitrogen atom they are attached to, and, in particular, those wherein x is 2 and B is a group of formula

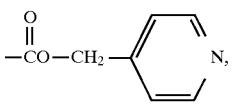

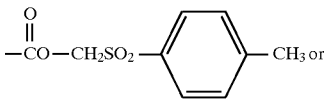

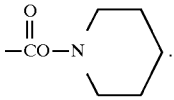

Preferred compounds of formula I are a1) perylenecarboxylic acid imides of formula

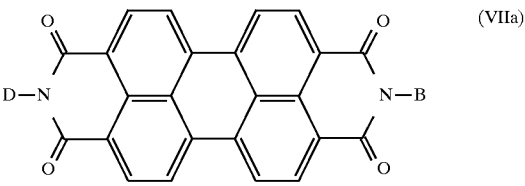

(VIIa)

or

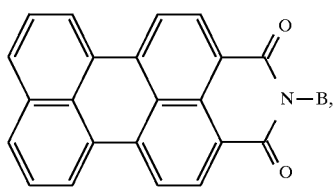
(VIIb)

wherein D is hydrogen, $C_1$–$C_6$-alkyl, phenyl, benzyl or phenetyl which are unsubstituted or substituted by halogen or $C_1$–$C_4$-alkyl, or is the same as B, a2) quinacridones of formula

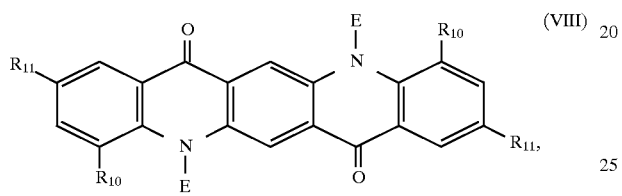
(VIII)

wherein $R_{10}$ and $R_{11}$ are each independently of the other hydrogen, halogen, $C_1$–$C_{18}$-alkyl, $C_1$–$C_4$-alkoxy or phenyl, a3) dioxazines of formula

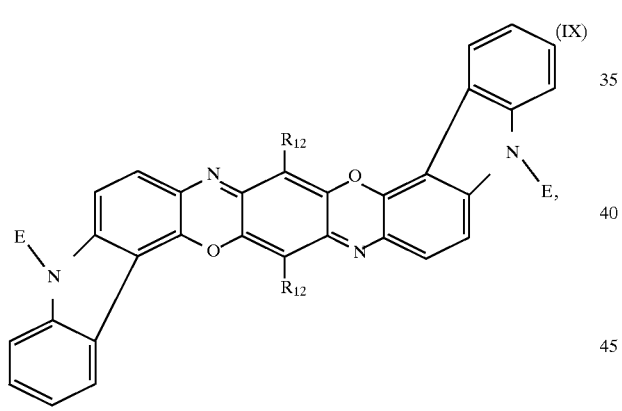
(IX)

wherein $R_{12}$ is hydrogen, halogen or $C_1$–$C_{18}$-alkyl, a4) isoindolines of formula

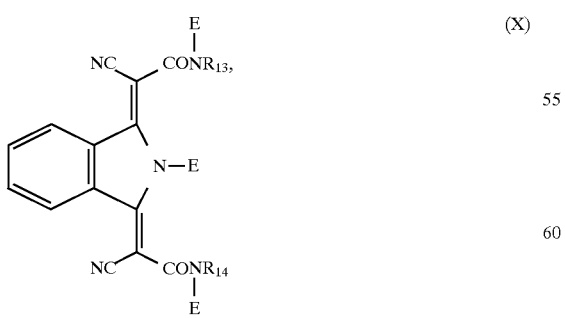
(X)

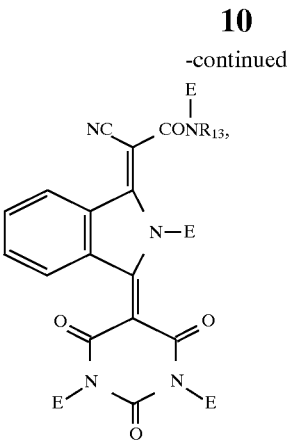
(XI)

wherein $R_{13}$ is a group

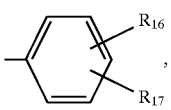

$R_{14}$ is hydrogen, $C_1$–$C_{18}$-alkyl, benzyl or a group

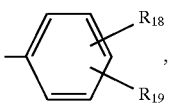

$R_{15}$ is has the same meaning as $R_{13}$, $R_{16}$, $R_{17}$, $R_{18}$ and $R_{19}$ are each independently of the other hydrogen, $C_1$–$C_{18}$-alkyl, $C_1$–$C_4$-alkoxy, halogen or trifluoromethyl,

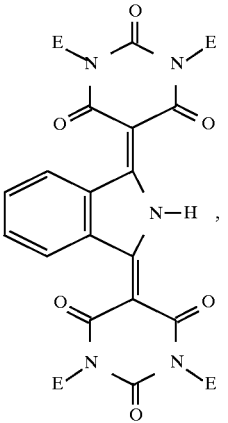
(XIIa)

-continued
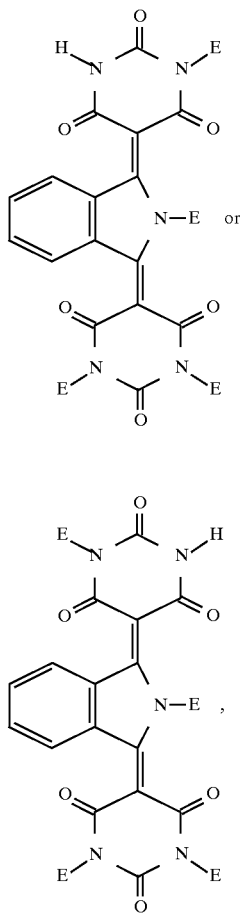
(XIIb)
(XIIc)
a5) indigo derivatives of formula
(XIII)
wherein $R_{20}$ is hydrogen, CN, $C_1$–$C_4$-alkyl, $C_1$–$C_4$-alkoxy or halogen,
a6) benzimidazolone-azocompounds of formula
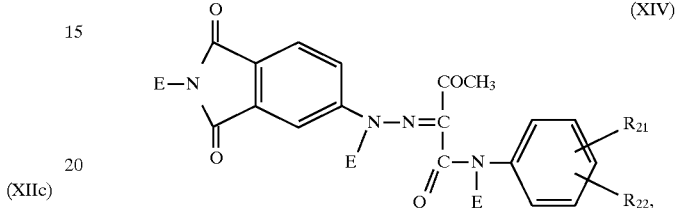
(XIV)
wherein $R_{21}$ and $R_{22}$ are each independently of the other hydrogen, halogen, $C_1$–$C_4$-alkyl or $C_1$–$C_4$-alkoxy,
a7) anthraquinoide compounds of formula
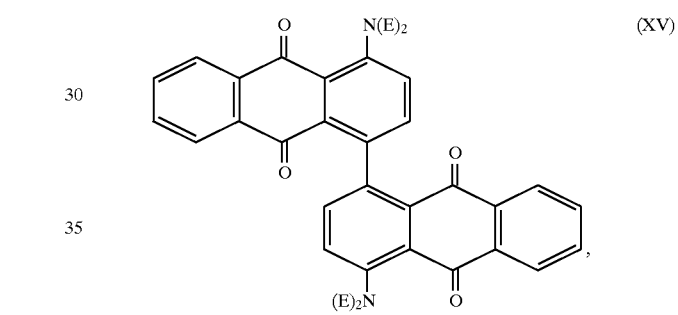
(XV)
a8) phthalocyanine compounds of formula
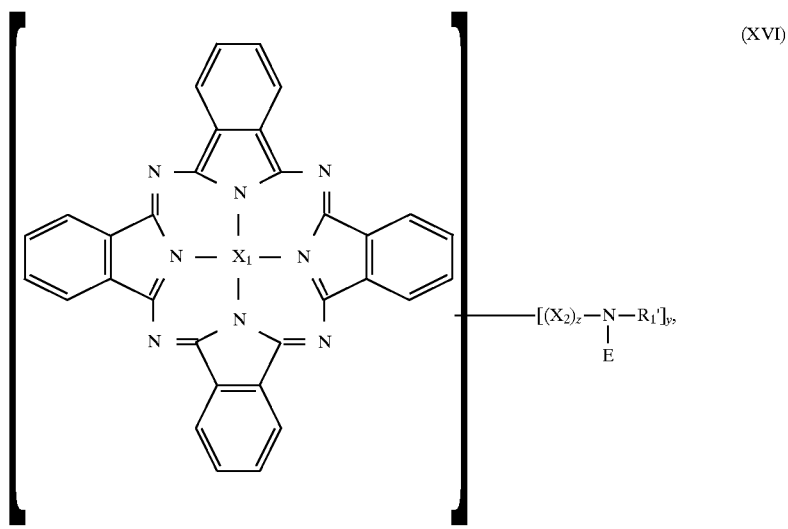
(XVI)

wherein $X_1$ is Ni, Fe, V, preferably $H_2$, Zn or Cu,
$X_2$ is —CH($R_2$')—, preferably —CH$_2$—, or —SO$_2$—,
$R_1$' is $C_1$–$C_4$-alkyl, —N(E)$R_2$', —NHCOR$_3$', —COR$_3$' or

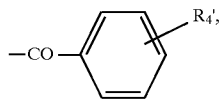

preferably hydrogen, —NHCOCH$_3$ or benzoyl,
$R_2$' is hydrogen or $C_1$–$C_4$-alkyl,
$R_3$' is $C_1$–$C_4$-alkyl, $R_4$' is hydrogen, halogen, $C_1$–$C_4$-alkyl or $C_1$–$C_4$-alkoxy, and
z stands for zero or 1, preferably 1, and y is an integer of 1–4, and a9) pyrrolo[3,4-c]pyrroles of formula

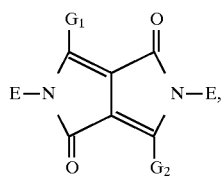 (XVII)

wherein $G_1$ and $G_2$ are each independently of the other a group of formula

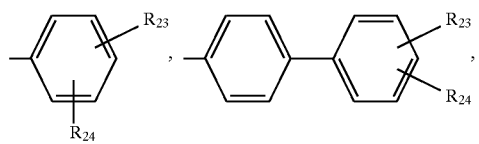

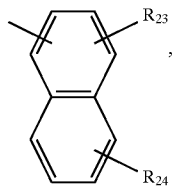

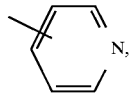

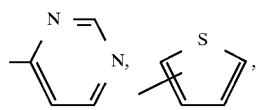

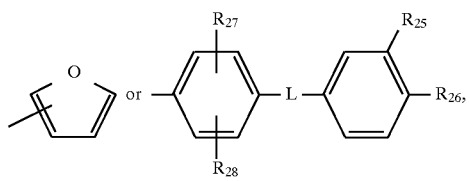

wherein $R_{23}$ and $R_{24}$ are each independently of the other hydrogen, halogen, $C_1$–$C_{18}$-alkyl, $C_1$–$C_{18}$-alkoxy, $C_1$–$C_{18}$-alkylmercapto, $C_1$–$C_{18}$-alkylamino, —CN, —NO$_2$, phenyl, trifluoromethyl, $C_5$–$C_6$-cycloalkyl, —C=N—($C_1$–$C_{18}$-alkyl),

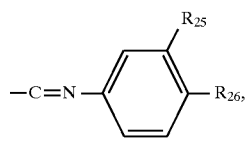

imidazolyl, pyrazolyl, triazolyl, piperazinyl, pyrrolyl, oxazolyl, benzoxazolyl, benzthiazolyl, benzimidazolyl, morpholinyl, piperidinyl or pyrrolidinyl, L is —CH$_2$—, —CH(CH$_3$)—, —C(CH$_3$)$_2$-, —CH=N—, —N=N—, —O—, —S—, —SO—, —SO$_2$—or —NR$_{29}$, $R_{25}$ and $R_{26}$ are each independently of the other hydrogen, halogen, $C_1$–$C_6$-alkyl, $C_1$–$C_{18}$-alkoxy or —CN, $R_{27}$ and $R_{28}$ are each independently of the other hydrogen, halogen or $C_1$–$C_6$-alkyl and $R_{29}$ is hydrogen or $C_1$–$C_6$-alkyl, whereby E in the above formulae stands for hydrogen or B, with the proviso that at least one E stands for B, and B has the above given meaning which is also valid for the above mentioned preferred compounds.

$C_1$–$C_{18}$-alkylmercapto is, for example, methylmercapto, ethylmercapto, propylmercapto, butylmercapto, octylmercapto, decylmercapto, hexamethylmercapto or octadecylmercapto, and $C_1$–$C_{18}$-alkylamino means, for example, methylamino, ethylamino propylamino, hexylamino, decylamino, hexadecylamino or octadecylamino.

$C_5$–$C_6$ cycloalkyl is, for example, cyclopentyl or cyclohexyl.

As component (a) of the instant compositions a single compound or a combination of two or more compounds may be used in the practice of the instant invention.

Preferred are the compounds

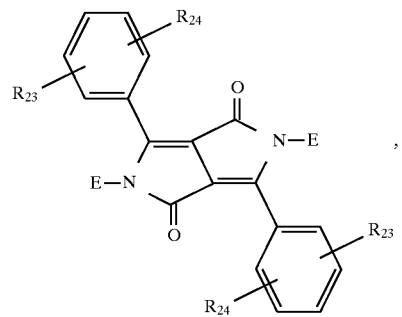

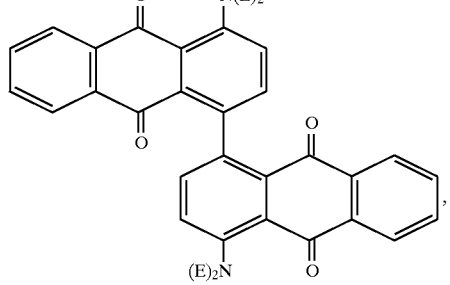

-continued

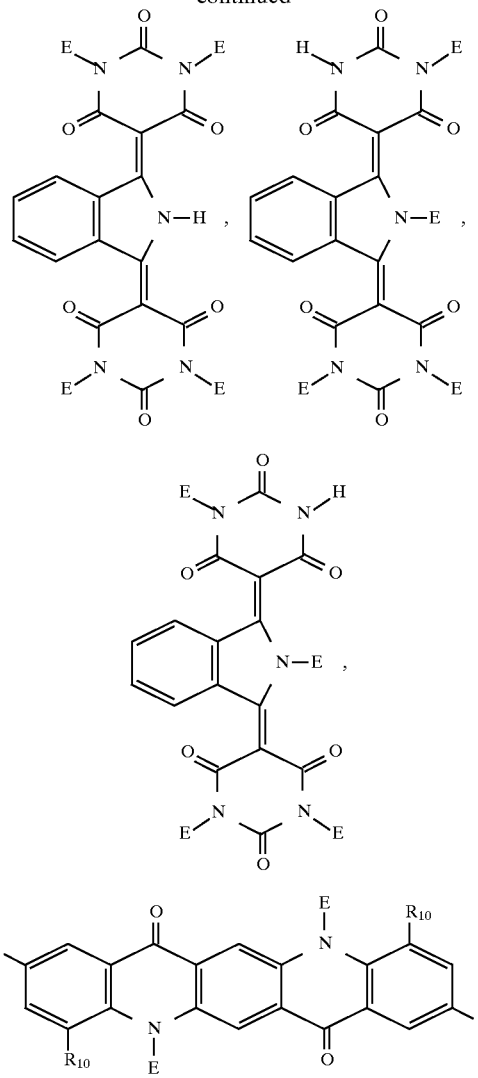

or mixtures thereof, where E is —C(=O)—O—C(CH$_3$)$_3$, and preferably where R$_{10}$ and R$_{11}$ are each independently of the other hydrogen, halogen, C$_1$–C$_5$-alkyl or C$_1$–C$_4$-alkoxy, and where R$_{23}$ and R$_{24}$ are hydrogen, halogen, C$_1$–C$_5$-alkyl, C$_1$–C$_4$-alkoxy, phenyl or cyano, particularly where R$_{10}$, R$_{11}$, R$_{23}$ and R$_{24}$ are hydrogen or chlorine.

For the production of N-substituted pyrrolopyrroles, it is mentioned, for example, in U.S. Pat. No. 4,585,878 that they can be obtained by reacting N-unsubstituted pyrrolo-[3,4-c] pyrrole with a compound containing the corresponding N-substituent as releasing groups in an organic solvent. In only one example which describes a compound containing an N-carbonyl group (example 9: N-benzoyl), 1,4-diketo-3, 6-diphenyl-pyrrolo[3,4-c]pyrrole is reacted with benzoyl chloride. In experiments to produce desired carbamates in analogous way by reacting with a corresponding acid chloride derivative, for example, a chlorocarbonic acid ester, it was found, unfortunately, that the carbamates could be obtained only at very low yield.

It was found, however, that the desired carbamate is obtained in surprisingly good yield by using the corresponding trihaloacetic esters or especially the corresponding dicarbonates. An improved yield, even if the improvement may be small, is also obtained if the reaction with an aliphatic acid chloride derivative, for example, chloromaleinic acid-butyl ester, is carried out in the presence of a base as a catalyst.

A suitable process for the production of compounds of formula I is characterized in that a compound of formula $$A(H)_x,$$

wherein A and x have the hereinbefore given meaning and H is attached to N, is reacted at a desired molar ratio with a dicarbonate of formula $$B—O—B,$$

or with a trihaloacetic acid ester of formula $$(R_a)_3C—B,$$

or with an azide of formula $$BN_3,$$

or with a carbonate of formula $$B—OR_b,$$

or with an alkylideneiminooxy formic acid ester of formula

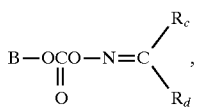

wherein B respectively has the hereinbefore given meaning,

R$_a$ is chloro, fluoro or bromo,

R$_b$ is C$_1$–C$_4$-alkyl or phenyl unsubstituted or substituted by halogen, C$_1$–C$_4$-alkyl, C$_1$–C$_4$-alkoxy or —CN, R$_c$ is —CN or —COOR$_b$, and R$_d$ is phenyl unsubstituted or substituted by halogen, C$_1$–C$_4$-alkyl, C$_1$–C$_4$-alkoxy or —CN, in an aprotic organic solvent in the presence of a base catalyst at a temperature between 0 and 400° C., especially between 20° and 200° C., preferably between 10° and 100° C., most preferably between 14° and 40° C., under atmospheric pressure, for 2 to 80 hours.

Preferably, the compound of formula A(H)$_x$ is reacted with a dicarbonate of formula B—O—B.

The compounds of formula A(H)$_x$, dicarbonates of formula B—O—B, trihaloacetic acid esters of formula (R$_a$)$_3$C—B, azides of formula BN$_3$, carbonates of formula B—OR$_b$ and alkylideneiminooxy formic acid esters of formula

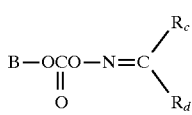

are known compounds. As far as some of them would be new, they can be produced in analogy with generally known methods.

The respective molar ratio of the above compounds A and reactive derivatives of B depends on the number of groups B to be introduced. A 2- to 10-fold excess of reactive derivatives of B is generally suitable.

As suitable solvents, there are exemplified, for example, ethers, such as tetrahydrofuran or dioxane, or glycolethers, such as ethyleneglycol-methylether, ethyleneglycol-ethylether, diethyleneglycol-monomethylether or diethyleneglycol-monoethylether, further dipolar-aprotic solvents, such as acetonitrile, benzonitrile, N,N-dimethylform amide, N,N-dimethylacetoamide, nitrobenzene, N-methylpyrrolidon, halogenated aliphatic or aromatic hydrocarbons, such as trichloroethane, benzene or benzene sunstituted by alkyl, alkoxy or halogen, e.g., toluene, xylene, anisole or chlorobenzene, or aromatic N-heterocycles, such as pyridine, picoline or quinoline. Preferred solvents are, for example, tetrahydrofuran, N,N-dimethylformamide and N-methylpyrrolidone. The above solvents can be used also as mixtures. 5–20 parts by weight of solvents are suitably used to 1 part by weight of the reactants.

The bases appropriate as catalysts are, for example, the alkali metals themselves, such as lithium, sodium or potassium, as well as their hydroxides and carbonates, or alkaliamides, such as lithium-, sodium- or potassiumamide or alkalihydrides, such as lithium-, sodium- or potassiumhydride, or alkali earth- or alkalialcoholates, which are derived especially from primary, secondary or tertiary aliphatic alcohols with 1 to 10 C-atoms, e.g., lithium-, sodium- or potassiummethylate, -ethylate, -n-propylate, -isopropylate, -n-butylate, -sec.-butylate, -tert.-butylate, -2-methyl-2-butylate, -2-methyl-2-pentylate, -3-methyl-3-pentylate, -3-ethyl-3-pentylate, and further organic aliphatic, aromatic or heterocyclic N-bases, especially, for example, diazabicyclooctene, diazabicycloundecene and 4-dimethylaminopyridine and trialkylamines, such as trimethyl- or triethylamine. The above bases can be used also as mixtures.

The organic N-bases, such as diazabicyclooctene, diazabicycloundecene and especially 4-dimethylaminopyrridine, are preferred.

Component (b) of the instant compositions, the positive or negative resist-type resin, polymer or prepolymer eligible for use in the present invention are, for example, b1) positive resists, such as diazoquinone resists based on phenolic resins such as novolac and diazonaphthoquinones, such as

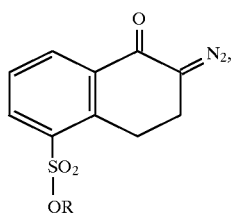

-continued

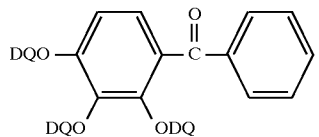

and

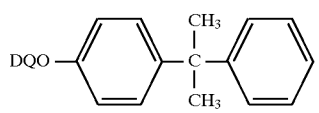

wherein R is for example hydrogen, $C_1$–$C_8$-alkyl or phenyl unsubstituted or substituted by $C_1$–$C_4$-alkyl, -alkoxy, halogen or —CN and DQ means diazonaphthoquinone, or polymers of the formula

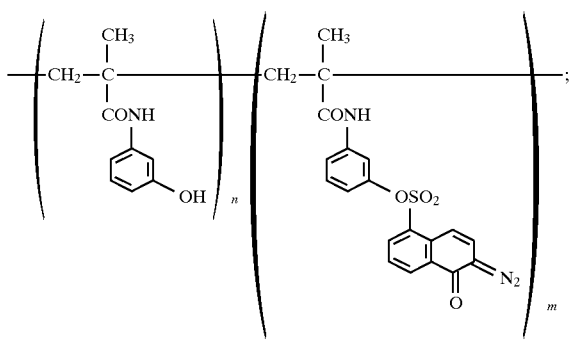

b2) negative resists, such as dichromated polymers such as dichromated gelatine, -starch, -poly(vinyl alcohol), -poly(vinylpyrrolidone),-poly(vinyl butyral) and -poly (amide acid) (PAA);

polymers having crosslinking groups in side chains, such as poly(vinyl cinnamate), poly(vinyl cinnamylidene acetate), poly(vinyl alcohol) to which chalcone or phenylene diacrylate are attached, polyesters of p-phenylenediacrylic acid PPDA) with glycols, such as

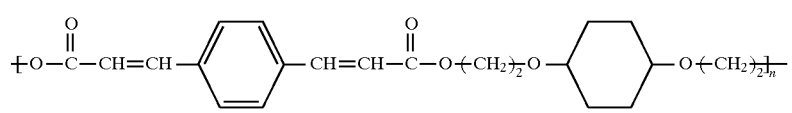

and polyesters based on styrylpyridine, such as

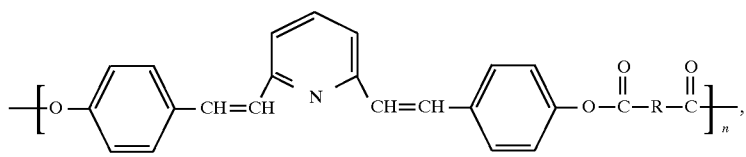
wherein R is
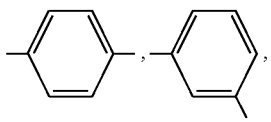
$-(CH_2)_4-$ or $-(CH_2)_8-$;
water processable resists, such as styrene-maleic anhydride copolymer, phenolic quaternary pyridinium salts, such as
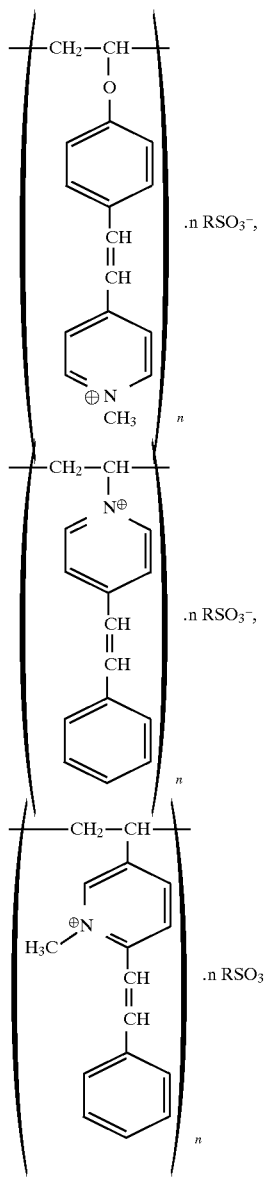
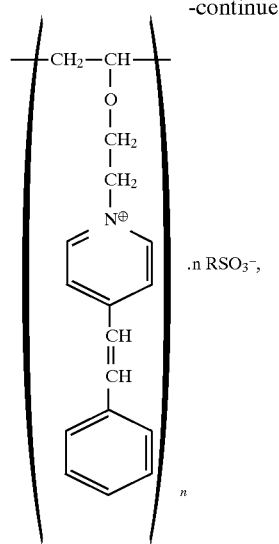
wherein for example R is hydrogen or $C_1$–$C_4$-alkyl and Ar is phenyl or naphthyl unsubstituted or substituted by $C_1$–$C_4$-alkyl, -alkoxy, halogen, —CN or —$NO_2$,
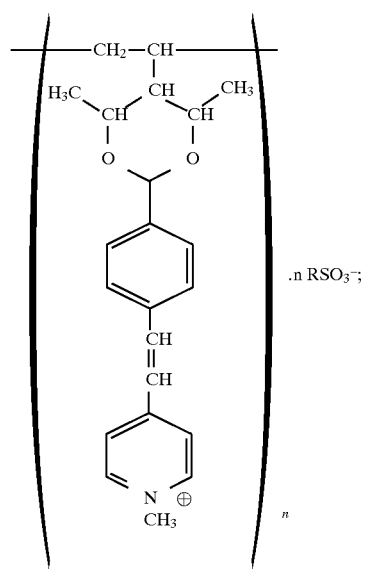

polymeric styryiquinolinium salts, such as

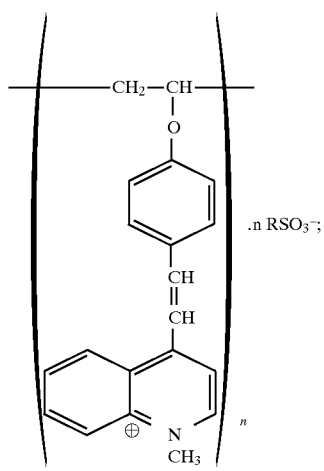

acrylic copolymers having dimethylmaleimide as a side chain having the general formula

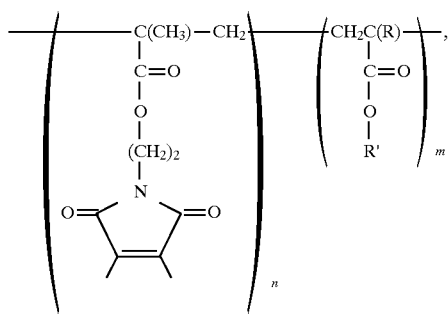

wherein for example R is $CH_3$ and R' is H, R is $CH_3$ and R' is $CH_3$, or R is H and R' is $C_2H_5$;

substituted poly(vinyl alcohol) containing diphenylcyclopropene as a side chain having the formula

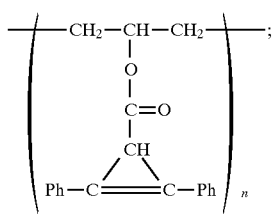

polymers having azido groups, such as

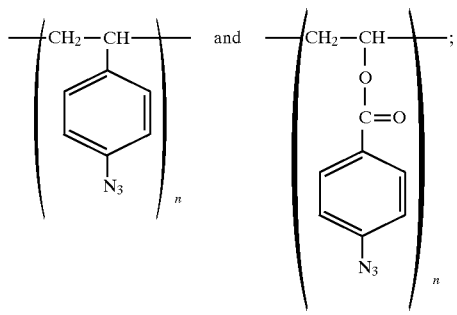

bis-azide resists based on poly(cis-isoprene) and bis-azides, such as 2,6-bis(4-azidobenzal)-4-methylcyclohexanone (ABC), 4,4'-diazidostilbene, 4,4'-diazidobenzophenone or 4,4'-diazidobenzalacetone;

water processable azido resists based on poly(acrylamide) or poly(vinylpyrrolidone) and water soluble bis-azides, such as

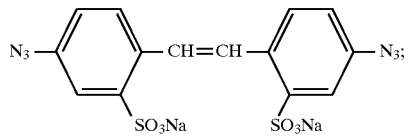

azide resists based on poly(vinyl phenol) and mono-azides, such as

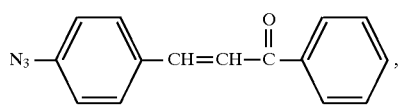

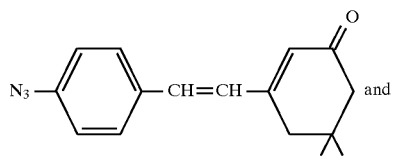

and

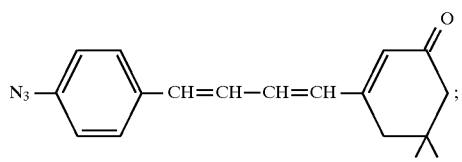

poly(vinyl alcohol) and poly(vinylpyridine) to which a bifunctional acylsilane, such as

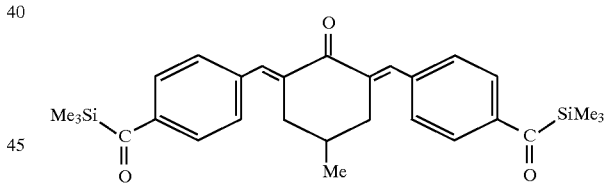

is added;

photocrosslinking copolymers of vinyl benzophenone and 4-dimethylaminostyrene; photoreactive polyimides having for example a repeating unit of

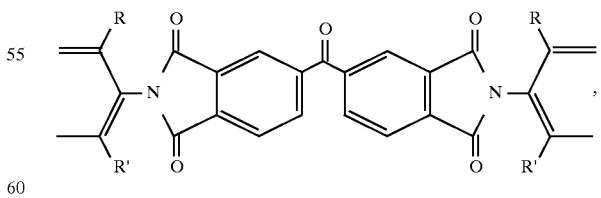

wherein R and R' are each independently of the other methyl or ethyl; and diazoresins, e.g., of formula

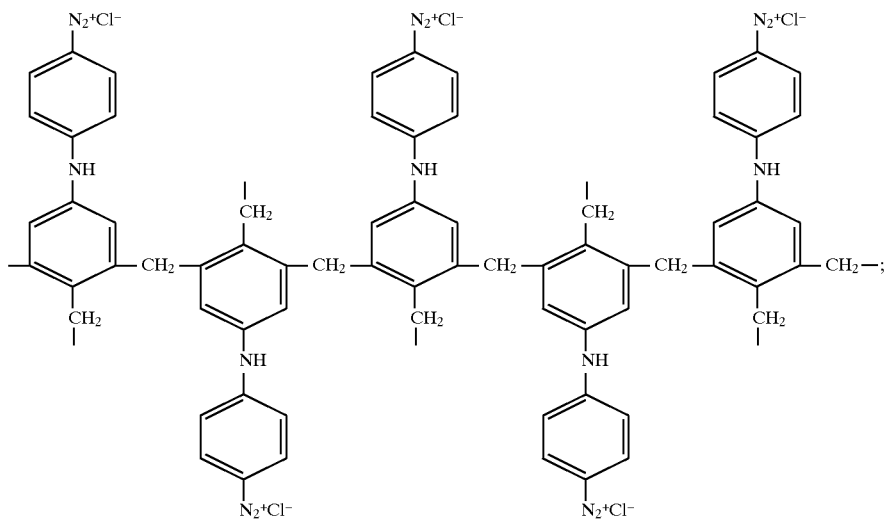

b3) photopolymers containing monomers, such as acrylates, methacrylates, acrylamide and styrene; crosslinkers, such as 1,6-hexanediol diacrylate, triethyleneglycol diacrylate, N,N'-methylenebis(acrylamide), trimethylolpropanetriacrylate, pentaerythritol triacrylate and pentaerythritol tetraacrylate; binders, such as polymers of the monomer used, polyesters, polyurethanes, nylons, polycarbonates and cellulose derivatives; fillers, such as organophilic silicas and clays; initiators, such as benzoin derivatives, anthraquinones plus hydrogen donors, and benzophenones and amines; and stabilizers, such as p-methoxyphenol, hydroquinones and naphthols;

especially those containing reactive binders, such as unsaturated polymers obtained by the condensation of maleic and fumaric acid with glycols, polyfunctional acrylates based on bisphenol A, such as

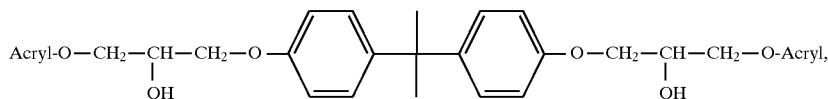

and

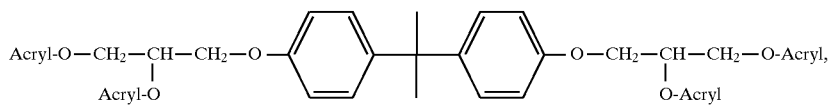

and other polyfunctional prepolymers, such as

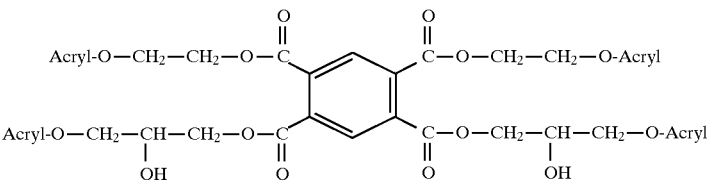

and

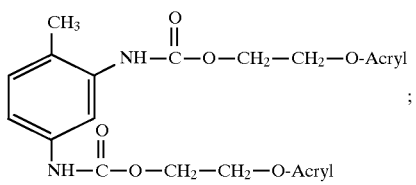

b4) positive deep-UV resists, such as modified diazo-quinone resist based on novolac and diazopyrazolidine dione, diazotetramic acid, diazopiperidine dione and diazo-Meldrum's acid of formula

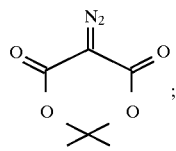

resists based on o-nitrobenzyl esters, such as

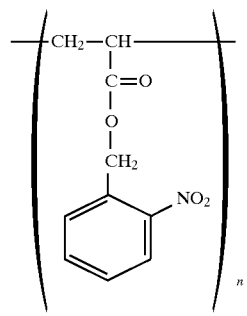

or mixtures of cholic acid of formula

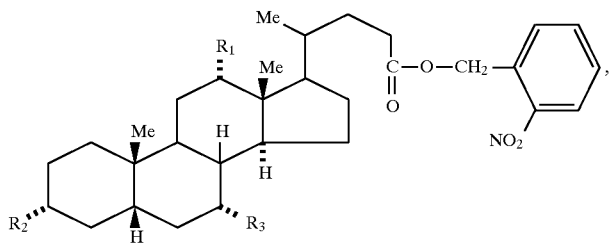

wherein for example $R_1$, $R_2$ and $R_3$ are each OH; $R_1$ and $R_2$ are OH and $R_3$ is H; $R_1$ and $R_3$ are H and $R_2$ is OH; $R_1$, $R_2$ and $R_3$ are each H; $R_1$, $R_2$ and $R_3$ are each $OCOCF_3$; $R_1$, $R_2$ and $R_3$ are each $OCOC(CH_3)_3$; or $R_1$, $R_2$ and $R_3$ are each $OCOCH_3$, with novolac or copolymer of methyl methacrylate and methacrylic acid; o-nitrobenzyl-substituted polyethers, such as

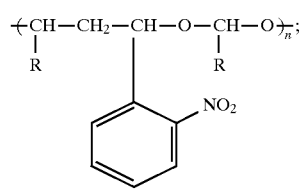

m-poly(nitroanilide) of formula

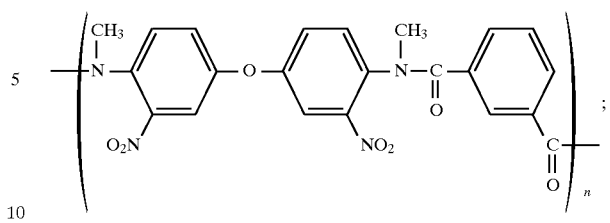

poly(p-acetoxystyrene);

poly(methyl methacrylate) (PMMA) derivatives, such as 3-oximino-2-butanone methacrylate (OMMA)-MMA copolymer, OMMA-methacrylonitrile-MMA terpolymer, MMA-indenone copolymer of formula

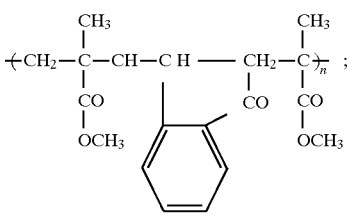

poly(methyl isopropyl ketone) (PMIPK) of formula

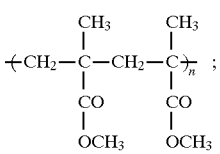

polymers containing triphenylcarbonium ion in their backbone, such as

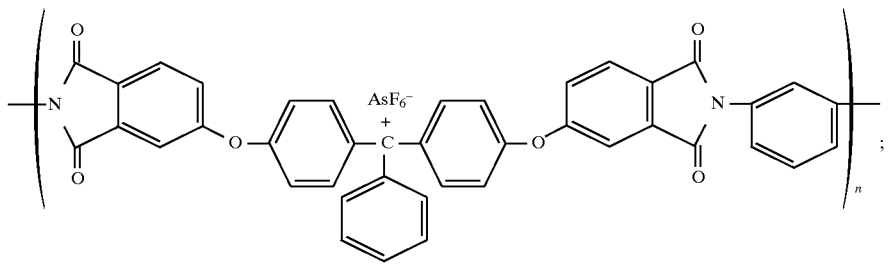

poly(tert-butoxycarbonyloxystyrene), preferably with an onium salt acid generator;
novolac with carbonates and onium salts or with naphthalene-2-carboxylic acid-tert-butyl ester;
polycarbonates, such as

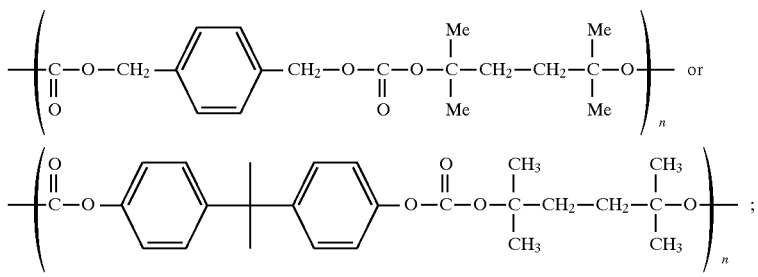

and copolymers of phthalaldehyde with o-nitrobenzaldehyde;

b5) negative deep-UV resists, such as bis-azide-cyclized rubber composition containing 4,4'-diazidodiphenyl sulfide, bis-azide-poly(vinyl phenol) composition containing 3,3'-diazidodiphenyl sulfone and bis-azido-poly (methyl methacrylate) composition containing 3,3'-diazidodiphenyl sulfone, epoxides with onium salts or with n-hexyloxy-diazonium hexaflurophosphate;

b6) positive electron resists, such as PMMA derivatives, such as poly(perfluorobutyl-methacrylate), poly(hexafluoro methacrylate), and especially poly(2,2,2-trifluoroethyl-α-chloroacrylate);
copolymers of MMA with methacrylic acid, acrylonitrile or methacrylic anhydride;
terpolymers of MMA, methacrylic acid and methacrylic anhydride;
poly(olefin sulfones), such as poly(butene sulfone);
novolacs with poly(olefin sulfone), such as poly(2-methylpentene-1-sulfone) (PMPS);
poly(p-tert-butoxycarbonyl oxystyrene);
poly(ortho-substituted 2-phenylethyl methacrylates);
and polystyrene-tetrathiofulvalene of formula

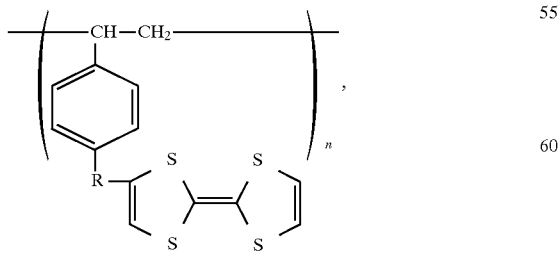

wherein R is for example $C_1$–$C_{10}$-alkylene, -alkenylene, $C_5$–$C_{10}$-cycloalkylene or phenylene unsubstituted or substituted by $C_1$–$C_4$-alkyl, -alkoxy, halogen or —CN;

b7) negative electron resists, such as epoxydized polybutadiene, poly(glycidyl methacrylate) (PGMA), copolymers of glycidyl methacrylate with ethylacrylate (COP);
copolymers of allyl methacrylate with hydroxyethyl methacrylate; and
copolymers of propargyl methacrylate with hydroxyethyl methacrylate;
polystyrene based resists, such as iodinated polystyrene and poly(chloromethylstyrene);
poly(vinyl naphthalenes); poly(chloromethylstyrene-co-2-vinyl naphthalene);
poly(vinyl pyridine) quaternized with methyl iodine;
diazoquinone-novolac photoresists;
Langmuir-Blodgett films of ω-tricosenoic acid, -tricocynoic acid and o-octadecyl acrylic acid;

b8) positive X-ray resists, such as Olin-Hunt resist HPR-204 (a commercial product);

b9) negative X-ray resists, such as poly(2,3-dichloro-1-propyl acrylate) (DCPA), poly(chloro-methylstyrene) (PCMS), chlorinated poly(methylstyrene) (CPMS), copolymers of allyl methacrylate with 2-hydroxyethylmethacrylate or glycidylmethacrylate;

10) chemically or thermally effectable polymers, such as poly-p-hydroxystyrene or novolac with melamine crosslinker, which system undergoes crosslinking by applying heat in the presence of acid catalysts;
copolymers of p-hydroxystyrene and esterified p-hydroxymethylstyrene, which crosslink under the presence of acid;
COP resins which crosslink under the presence of amines; latent polyamines, such as

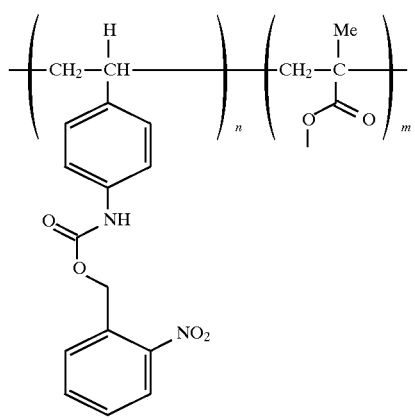

which undergo crosslinking upon irradiation with light under the presence of bis-epoxide; epoxy resins, such as glycidylated cresol novolac, bisphenol A diglycidyl ether, hydantoin-N,N'-bisglycide, propylene-1,3-bishydantoin-2-hydroxytriglycide, p-amino-phenoltriglycide, diaminodiphenylmethanetetraglycide, vinylcyclohexene dioxide, 3,4-epoxycyclohexylmethyl-3,4-epoxycyclohexanecarboxylate and mixtures thereof, which crosslink in the presence of appropriate curing agents, such as polyamines, novolacs, polyaminoamides and polycarboxylic anhydrides; esters of poly(vinyl benzoic acid), such as polymers having repeating groups

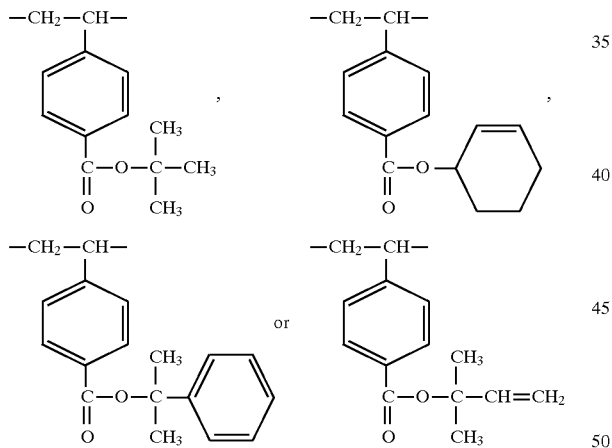

which transform to poly(vinyl benzoic acid) by heating in the presence of catalytic amount of acid;

blocked poly-p-hydroxystyrenes, such as having repeating groups

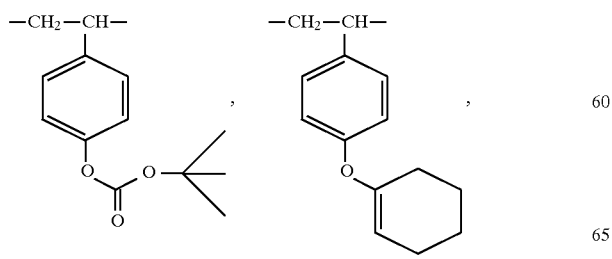

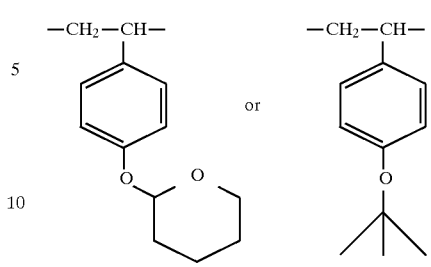

which transform to poly-p-hydroxystyrene by heating in the presence of catalytic amount of acid;

esters of polyacrylates and polymethacrylates, such as having repeating groups

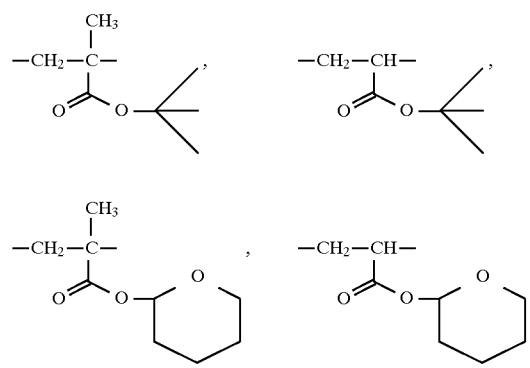

which transform to polyacrylic- or polymethacrylic acid by heating in the presence of catalytic amount of acid;

polycarbonates, such as having repeating groups

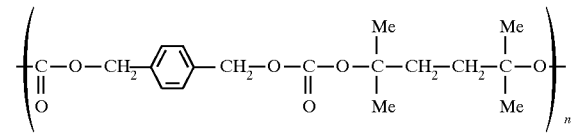

which depolymerize under heating; and mixtures of methacrylic acid-methyl methacrylate copolymer and methacryloyl chloride-methyl methacrylate copolymer, which crosslink by heating;

b11) positive ion beam resists, such as poly(methyl methacrylate), poly(methylvinyl ketone), poly(tert-butyl methacrylate) and poly(butene sulfone);

b12) negative ion beam resists, such as poly(vinyl acetate), poly(vinyl cinnamate), poly(methyl siloxane), poly(glycidyl methacrylate-co-ethyl acrylate), polystyrene, poly(4-chlorostyrene), poly(4-bromostyrene) and novolac;

b13) silicon containing positive resists, such as poly(dimethylsiloxane), poly(phenylmethylsiloxane), and siloxane substituted propyl methacrylates, such as

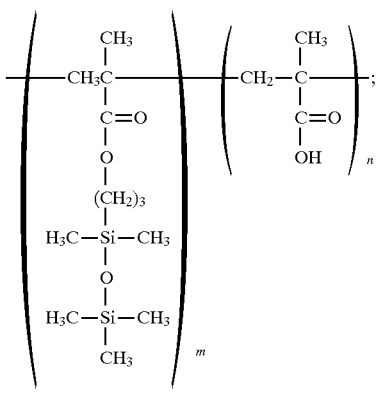

b14) silicon containing negative resists, such as copolymers of trimethylsilylethyl styrene with chlorostyrene, chloromethylated poly(diphenyl siloxane), brominated poly(1-trimethylsilyl propylene), poly(triallyl phenylsilane) together with 2,6-bis(4'-azidobenzal)-methylcyclohexanone, and poly(trimethylsilylmethyl styrene) in combination with 1,2,4-trichlorobenzene and 3,3'-diazidodiphenyl sulfone.

Preferred components (b) of the instant compositions are positive resists of b1), negative resists of b2), photopolymers of b3), positive deep-UV resists of b4), negative deep-UV resists of b5), and chemically and thermally effectable polymers of b10).

Especially preferred are diazoquinone resists; dichromated polymers, such as dichromated gelatine, -starch, -poly(vinyl alcohol), -poly(vinylpyrrolidone), -poly(vinyl butyral) and -poly(amideacid);

polymers having crosslinking groups in side chains, such as poly(vinyl cinnamate), poly(vinyl cinnamylidene acetate), poly(vinyl alcohol) to which chalcone or phenylene diacrylate are attached, and polyesters of p-phenylenediacrylic acid (PPDA) with glycols;

bis azide resists based on poly(cis-isoprene) and bis-azides, such as 2,6-bis-(4-azidobenzal)-4-methylcyclohexanone (ABC), 4,4'-diazidostilbene, 4,4'-diazidobenzophenone and 4,4'-diazidobenzolactone;

water processable azido resists;

photopolymers containing reactive binders, the binders being for example, unsaturated polymers obtained by the condensation of maleic and fumaric acid with glycols, polyfunctional acrylates and polyfunctional prepolymers;

poly(tert-butoxycarbonyloxystyrene) with an onium salt acid generator;

bis-azide-cyclized rubber compositions containing 4,4'-diazidodiphenyl sulfide and bis-azide-poly(vinyl phenol) compositions containing 3,3'-diazidodiphenyl sulfon;

poly(p-hydroxystyrene) or novolacs with melamine crosslinker together with acid catalysts, esters of poly (vinyl benzoic acid), poly(acrylic acid) and poly (methacrylic acid) having releasing groups which groups are released by heating in the presence of catalytic acid, and blocked poly-p-hydroxystyrenes.

The above mentioned examples of suitable components (b) of the instant compositions are well known in the art and are described for example in A. Reiser, Photoreactive Polymers, John Wiley & Sons, 1989.

If the above composition further contains a catalyst, the polymer structuring and pigment formation is facilitated.

It is preferred, therefore, that the above composition further contains (c) a catalyst for positive or negative polymer structuring and/or pigment formation from the above (b) and (a).

The catalyst (c) is preferably an acid, a base or a compound selectively absorbing a specific wavelength of electromagnetic radiation, e.g., in IR/NIR, and in particular, a latent acid or base.

Examples of such latent acids are, for example, those capable of forming acids under actinic irradiation, such as onium salts, e.g., diazonium, sulfonium, sulfoxonium and iodonium salts.

Preferred are the sulfonium salts of formula XVIII $(Ar_1)_s(R_{30})_t(R_{31})_u S^+ X^-$     (XVIII), wherein for example $Ar_1$ is phenyl, naphthyl or phenyl-$COCH_2$— which is unsubstituted or substituted by $C_1$–$C_4$-alkyl, $C_1$–$C_4$-alkoxy, —OH and/or nitro, $R_{30}$ is $C_1$–$C_6$-alkyl or $C_3$–$C_7$-cycloalkyl, $R_{31}$ is tetrahydrothienyl, tetrahydrofuryl or hexahydropyryl, s is 0, 1, 2 or 3, t is 0, 1 or 2, u is 0 or 1, in which the sum s+t+u is 3, and $X^-$ is a chloride-, bromide- or iodide anion, $BF_4^-$, $PF_6^-$, $AsF_6^-$, $AsbF_6^-$, $FSO_3^-$ or the anion of an organic sulfonic acid or carboxylic acid.

Preferably, phenyl-, naphthyl- and phenacyl groups $Ar_1$ are singly substituted, especially by Cl, Br, methyl, methoxy, —OH or nitro. More preferably, these residues are not substituted. $R_{30}$ is preferably $C_1$–$C_4$-alkyl, especially methyl or ethyl. Preferably, s is 2 or 3, t is 1 or 0 and u is 0 and more preferably, s is 3 and t and u are 0. Most preferably, $Ar_1$ is unsubstituted phenyl and s is 3.

If $X^-$ means the anion of an organic sulfonic acid or carboxylic acid, then anions of aliphatic, cycloaliphatic, carbocyclic-aromatic, heterocyclic-aromatic or araliphatic sulfon- or carboxylic acids can be used. These anions can be substituted or unsubstituted. Sulfonic or carboxylic acids with lower nucleophilicity, such as partially- or perfluorinated derivatives or derivatives substituted at the position neighboring the acid groups are preferred. Examples of substituents are halogen such as chlorine or more preferably fluorine, alkyl such as methyl, ethyl or n-propyl, or alkoxy such as methoxy, ethoxy, or n-propoxy.

Examples of aliphatic sulfonic acids are methane-ethane-, n-propane- n-butane- and n-hexane sulfonic acid or corresponding partially- or perfluorinated derivatives.

Examples of aliphatic carboxylic acids are formic acid, acetic acid, propionic acid, butyric acid, pivalic acid, capronic acid, 2-ethylhexyl carboxylic acid and fatty acids, such as lauric acid, myristinic acid or stearic acid, as well as partially- or perfluorinated derivatives of these acids.

Examples of cycloaliphatic sulfonic- or carboxylic acids are cyclohexane carboxylic acid, campher-10-sulfonic acid or their partially- or perfluorinated derivatives.

Examples of carbocyclic-aromatic sulfonic acids are benzene-, toluene-, ethylbenzene-, isopropylbenzene-, dodecylbenzene- or dimethylbenzene sulfonic acid, 2,4,6-triisopropylbenzene sulfonic acid, 2,4,6-trimethylbenzene sulfonic acid, naphthalene sulfonic acid, -disulfonic acid or -trisulfonic acid and the corresponding alkylated or partially- or perfluorinated derivatives of these sulfonic acids.

Examples of heterocyclic-aromatic sulfonic acids are pyridine-, thiophene- or pyrrole sulfonic acid and the corresponding partially- or perfluorinated derivatives of these compounds.

Examples of carbocyclic-aromatic carboxylic acids are benzoic acid, toluene-, ethylbenzene-, isopropylbenzene- or dimethylbenzene carboxylic acid, naphthalene carboxylic acid or anthracene carboxylic acid and the corresponding partially- or perfluorinated derivatives of these compounds.

Examples of heterocyclic-aromatic carboxylic acids are pyridine-, thiophene- or pyrrole carboxylic acid as well as the corresponding partially- or perfluorinated derivatives of these compounds.

Examples of araliphatic carboxylic acids are benzyl carboxylic acid, α-methylbenzyl carboxylic acid and cinnamic acid, as well as the corresponding partially- or perfluorinated derivatives of these compounds.

$X^-$ in formula XVIII above is preferably the monovalent anion of an organic sulfonic acid, especially a partially- or perfluorinated sulfonic acid. These anions are characterized by a particulary low nucleophilicity.

Examples of particularly appropriate sulfonium salts of formula XVIII are triphenylsulfonium bromide, triphenylsulfonium chloride, triphenylsulfonium iodide, triphenylsulfonium hexafluorophosphate, triphenylsulfonium hexafluoroantimonate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiophenium chloride and 4-hydroxy-2-methylphenylhexahydrothiopyrylium chloride.

As onium compounds iodonium salts of formula XIX

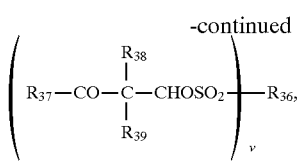

can be used, wherein for example

Ar2 and $Ar_3$ are each independently of the other phenyl or naphthyl which is unsubstituted or substituted by $C_1$–$C_4$-alkyl, $C_1$–$C_4$-alkoxy, halogen and/or nitro or $Ar_2$ and $Ar_3$ together form a group of formula XX

wherein $R_{32}$ is $C_1$–$C_4$-alkyl, $C_1$–$C_4$-alkoxy, halogen or nitro and Y is a direct bond, —O—, —$CH_2$— or —CO— and $X_1^-$ means a chloride-, bromide- or iodide anion.

Iodonium salts of formula XIX are described, for example, in GB-A 1 539 192.

As latent acids eligible for use in the present invention, compounds of formulae XXI–XXVIII which generate sulfonic acid under actinic irradiation are also appropriate:

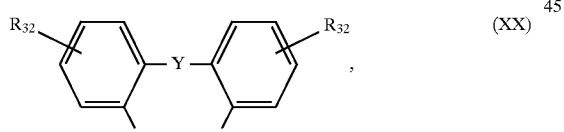

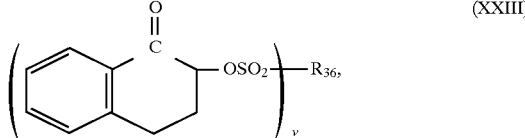

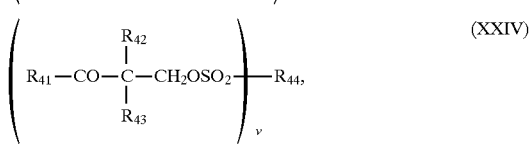

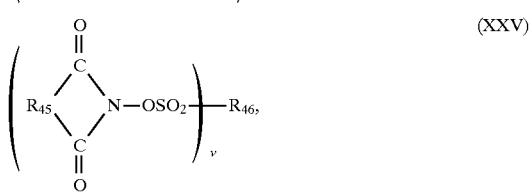

$(R_{47}CON(R_{43})—OSO_2 {\rightarrow} R_{46},$ (XXVI)

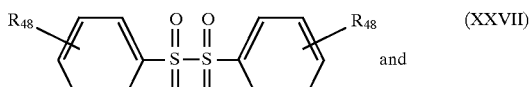

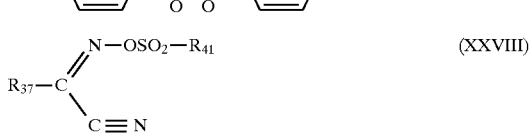

wherein v is 1 or 2, preferably 1, $R_{33}$ is phenyl or naphthyl which is unsubstituted or substituted by 1–3-Cl, —Br, —CN, —$NO_2$, $C_1$–$C_4$-alkyl, $C_1$–$C_4$-alkoxy, $C_1$–$C_4$-alkylthio, phenoxy, phenylthio, $C_1$–$C_4$-alkylamino, $C_2$–$C_4$-dialkylamino or benzoyl, especially phenyl unsubstituted or singly substituted by —Cl, methyl or methoxy, $R_{34}$ is hydrogen or $C_1$–$C_4$-alkyl and $R_{35}$ is hydrogen, $C_1$–$C_4$-alkyl or phenyl or $R_{34}$ and $R_{35}$ together with the bonding-C-atom form a cyclopentane or cyclohexane ring, $R_{36}$ is, if v is 1, then $C_1$–$C_{18}$-alkyl, phenyl or naphthyl which is unsubstituted or substituted by $C_1$–$C_4$-alkyl, or cyclopentyl, cyclohexyl or campheryl and if v is 2, then $C_2$–$C_8$-alkylene or phenylene, $R_{37}$ is phenyl or naphthyl which is unsubstituted or substituted by 1–3-Cl, —Br, $C_1$–$C_4$-alkyl, $C_1$–$C_4$-alkoxy, $C_1$–$C_4$-alkylthio, phenyl, phenoxy, phenylthio, $C_1$–$C_4$-alkyl-CONH—, benzoylamino or dimethylamino, and in particular phenyl which is unsubstituted or singly substituted by —Cl, $C_1$–$C_4$-alkoxy, methylthio or phenyl, $R_{38}$ is —OH or $C_1$–$C_4$-alkyl, $R_{39}$ is $C_1$–$C_4$-alkyl or phenyl, $R_{40}$ is hydrogen, $C_1$–$C_4$-alkyl, furyl or —$CCl_3$ or $R_{39}$ and $R_{40}$ together with the bonding-C-atom form a cyclopentane- or cyclohexane ring, $R_{41}$ and $R_{42}$ are each independently of the other phenyl which is unsubstituted or substituted by halogen, $C_1$–$C_4$-alkyl or $C_1$–$C_4$-alkoxy, $R_{43}$ is hydrogen or $C_1$–$C_4$-alkyl, $R_{44}$ is, if v is 1, then $C_1$–$C_6$-alkyl, phenyl, naphthyl or benzyl and if v is 2, then $C_1$–$C_6$-alkylene, phenylene or xylylene, $R_{45}$ is phenylene or naphthylene or —CH=CH— which is unsubstituted or substituted by halogen, nitro, $C_1$–$C_8$-alkyl, $C_1$–$C_4$-alkoxy or $C_1$–$C_4$-alkylthio, $R_{46}$ is, if v is 1, then $C_1$–$C_{12}$-alkyl, or phenyl which is unsubstituted or substituted by halogen, nitro, $C_1$–$C_4$-alkyl or $C_1$–$C_4$-alkoxy, and if v is 2, then $C_2$–$C_8$-alkylene or phenylene, $R_{47}$ is phenyl or naphthyl which is unsubstituted or substituted by halogen, nitro, —CN, $C_1$–$C_4$-alkyl, methoxy, ethoxy, dimethylamino or benzoyl, and $R_{48}$ are each independently of the other $C_1$–$C_4$-alkyl.

Alkyl- alkoxy-, alkylthio-, alkylamino-, dialkylamino-, alkylcarbamoyl- and alkylene groups as defined can be straigh-chained or branched, however, preferably straight-chained. Halogen means, in particular, —Cl or —Br.

Compounds of formulae XXI–XXVI are described, for example, in EP-A 0 166 682 and EP-A 0 085 024 as well as the literature references cited therein. Particularly preferred compounds of formulae XXI–XXVI are phenacyl-p-methylbenzenesulfonate, benzoin-p-toluenesulfonate, 3-(p-toluenesulfonyloxy)-2-hydroxy-2-phenyl-1-phenyl-1-propanone-(α-(p-toluenesulfonyl oxy)methylbezoin),N-(p-dodecylbenzenesulfonyloxy)-1,8-naphthalimide and N-(phenylsulfonyloxy)-1,8-naphthalimide.

Further appropriate compounds to be used as latent acids are o-nitrobenzaldehydes, which transformed to o-nitrobenzoic acid, such as 1-nitrobenzaldehyde and 2,6-dinitrobenzaldehyde; α-halogenacetophenone, such as α,α,α-trichloroacetophenone and p-tert.butyl-α,α,α-trichloroacetophenone, as well as sulfonic acid esters of o-hydroxyacetophenons, such as 2-hydroxybenzophenone methanesulfonate and 2,4-hydroxybenzophenone-bis-(methanesulfonate).

Finally, such compounds containing aromatically bound chlorine or bromine as described in EP-A 0 318 649, for example, compounds of formula XXIX with at least one aromatically bound chlorine or bromine atom, are appropriate as latent acids:

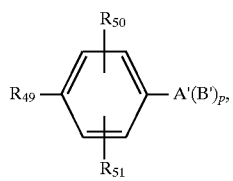
(XXIX)

wherein for example p is, for example, 0 or 1, $R_{49}$ is —COOH, —$OR_{52}$ or —$SR_{52}$, $R_{50}$ and $R_{51}$ are each independently of the other hydrogen, —Cl, —Br, alkyl which may be substituted by aryl, alkoxy, aryloxy, —OH or —F, or aryl which may be substituted by alkoxy, aryloxy, —OH or halogen, $R_{52}$ is hydrogen, alkyl, aryl or acyl which may be substituted analogously to $R_{50}$, A' is, if p is 0, then hydrogen, —Cl, —Br, or alkyl which may be substituted analogously to $R_{50}$ and if p is 1, then —$SO_2$—, propylene or perfluoroalkylene; and B' is a group

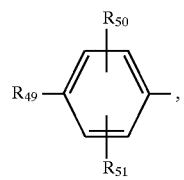, alkylcarbonyl, alkoxycarbonyl or substituted sulfonylimidecarbonyl.

Examples of the compunds of this kind are hexafluorotetrabromo-bisphenol A, 1,1,1-tris-(3,5-dibromo-4hydroxyphenyl)ethane and N-(2,4,6-tribromophenyl)-N'-(p-toluenesulfonyl)urea.

As compounds of the latent acid, those of formula XVIII wherein $Ar_1$ is phenyl, s is 3, and $X^-$ is $SbF_6^-$, $PF_6^-$ and especially the anion of an aliphatic, partialfluoroaromatic or perfluoroaromatic sulfonic acid, are preferred inparticular. Particularly preferred anions $X^-$ are $CF_3SO_3^-$, $C_2F_5SO_3^-$, n-$C_3F_7SO_3^-$, n-$C_4F_9SO_3^-$, n-$C_6F_{13}SO_3^-$. Triphenylsulfonium trifluoromethanesulfonate is used most preferably as the latent acid.

If the catalysts to be used in the present invention are latent bases, then those capable of forming bases under actinic irradiation are preferred.

As examples of such preferred latent bases, there are compounds of formula XXX $$(Co(NR_{53}R_{54}R_{55})_5Z)^{2+} \quad (XXX),$$

wherein

Co is cobalt (III) ion, $R_{53}$, $R_{54}$, and $R_{55}$ are each independently of the other hydrogen, $C_1$–$C_6$-alkyl or $C_3$–$C_7$-cycloalkyl, and Z is halogen.

Preferably, $R_{53}$, $R_{54}$ and $R_{55}$ are each independently of the other straight chained $C_1$–$C_4$-alkyl and Z is Cl or Br.

Further examples of preferred latent bases are those represented by formula XXXI $$Ar_4R_{56}OCONR_{57}R_{58} \quad (XXXI)$$

wherein $Ar_4$ is phenyl or naphthyl which is unsubstituted or substituted by 1–3-Cl, —Br, —CN, —$NO_2$, $C_1$–$C_4$-alkyl, $C_1$–$C_4$-alkoxy, $C_1$–$C_4$-alkylthio, phenoxy, phenylthio, $C_1$–$C_4$-alkylamino, $C_2$–$C_4$-dialkylamino or benzoyl, $R_{56}$ is $C_1$–$C_6$-alkylene which is unsubstituted or substituted by halogen, —$NO_2$, —CN, —OH, $C_1$–$C_4$-alkyl or $C_1$–$C_4$-alkoxy, $R_{57}$ and $R_{58}$ are each independently of the other hydrogen, $C_1$–$C_6$-alkyl or $C_3$–$C_7$-cycloalkyl.

Preferably, $Ar_4$ is phenyl substituted by —Cl, methyl, ethyl propyl, methoxy, ethoxy, propyloxy or nitro, $R_{56}$ is methylene substituted by methyl, ethyl or propyl, and $R_{57}$ and $R_{58}$ are each independently of the other hydrogen, $C_1$–$C_4$-alkyl or $C_5$–$C_6$-cycloalkyl.

Preferred catalysts (c) of the instant compositions are sulfonium salts.

Particularly preferred are triphenylsulfonium triluoromethanesulfonate and the compounds

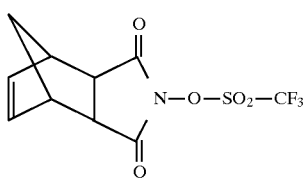

and

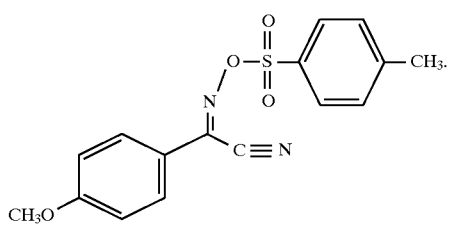

The composition for forming structured color images according to the present invention can generally be prepared simply by mixing the instant components (a), (b) and optionally (c).

Component (a) is chosen according to the color of the regenerated pigment particles.

The positive or negative resist-type resin, polymer or prepolymer of component (b) should be chosen according to the kind of desired color images, i.e., positive images or negative images, and the treatment to be applied to the composition, i.e., heat, electromagnetic irradiation such as UV-, visible-, electron-, neutron-, laser- or X-ray irradiation or a combination thereof.

For example, if it is desired to obtain positive images by visible light irradiation, one of the positive resists as classified b1) is chosen. If it is desired to obtain negative images by X-ray irradiation, one of the negative X-ray resists as classified b9) is chosen. If it is desired to obtain negative images by laser irradiation, one of the heat-curable polymers, such as a mixture of methacrylic acid-methyl methacrylate copolymer and methacryloyl chloride-methyl methacrylate copolymer, contained in chemically or thermally effectable polymers as classified b10) is chosen. In the last mentioned case, it is preferred to add, in the polymer, a compound having absorption at the wavelength of the incident laser beam so as to effectively transform optical energy into thermal energy. If it is desired to obtain negative images by applying a combination of heat and electromagnetic irradiation, then such a system as containing poly-p-hydroxystyrene with melamine crosslinker of b10) is chosen. The choice of other resins, polymers or prepolymers, should be done likewise.

If component (c) is not added, components (a) and (b) are compounded at a ratio of from 0.01:99.99 by weight to 80:20 by weight, preferably from 1:99 by weight to 70:30 by weight, more preferably from 5:95 by weight to 60:40 by weight, and most preferably from 10:90 by weight to 50:50 by weight.

If component (c) is added, the compounding ratio among components (a):(b):(c) is chosen so as to be from 0.01:99.98:0.01 by weight to 75:5:20 by weight, preferably from 1.00:98.90:0.10 by weight to 70:15:15 by weight, more preferably from 5:94:1 by weight to 60:30:10 by weight, and most preferably from 10:88:2 by weight to 50:42:8 by weight.

The component (c) is preferably contained in the composition.

The above prepared compositions are preferably diluted with a solvent so as to allow easy coating on a suitable substrate.

Examples of appropriate solvents are ethers, such as tetrahydrofuran and dioxane; glycolethers, such as ethyleneglycol-methylether, ethyleneglycol-ethylether, diethyleneglycol-monomethylether and diethyleneglycol-monoethylether; aprotic solvents, such as acetonitrile, benzonitrile, N,N-dimethylformamide, N,N-dimethylacetoamide, nitrobenzene, N-methylpyrrolidone, halogenated aliphatic or aromatic hydrocarbons, such as trichloromethane, benzene unsubstituted or substituted with alkyl, alkoxy or halogen, such as toluene, xylene, anisole and chlorobenzene, and aromatic N-heterocycles, such as pyridine; picoline and quinoline; alcohols, such as methanol, ethanol and diacetone alcohol; carboxylates and lactones, such as propylene carbonate, ethyl acetate, methyl propionate, ethyl benzoate, γ-butyrolactone and γ-valerolactone; sulfoxides, such as dimethyl sulfoxide; sulfones, such as dimethyl sulfone and diethyl sulfone; and ketones, such as dimethyl ketone, methyl ethyl ketone and cyclohexanone and others; water may be used for water-soluble components such as poly(vinyl alcohol).

The composition of the present invention is diluted preferably with one or a mixture of the above solvents so that the solid content thereof is between 1 and 90 wt %, preferably between 5 and 80 wt %, more preferably between 10 and 70 wt %, and most preferably between 20 wt % and 60 wt % based on the solution.

The above prepared solution containing the composition of the present invention is in general applied over an appropriate substrate, subjected to electromagnetic irradiation such as visible-, UV-, laser- or X-ray irradiation, or electron- or neutron irradiation and/or heating, and optionally to development using appropriate developers, so as to form color images for optical- and thermal recording or to fabricate color filters for LCDs.

In another aspect of the present invention, there is provided a method for producing colored patterns or images in which the pattern or image layer is colored with insoluble pigment, locally regenerated from its soluble precursor, including the steps of (1) forming a polymer layer containing dissolved pigment precursor using a composition comprising components (a), (b) and optionally (c), and (2) locally regenerating the pigment from the above soluble precursor by chemical-, photolytical- or thermal means, by laser or other sources of irradiation.

The expression "forming a polymer layer", as specified in step (1) of the above method, is meant to include a layer covering the whole surface of the substrate as well as a layer which may only cover certain areas of the substrate and which layer was applied imagewise or patternwise, respectively.

One advantageous way to regenerate the pigment in step (2) is by laser marking.

The preparation of the above composition in step (1) is carried out as described in the foregoing text.

As methods for forming polymer pattern or image layers, there are known various techniques like photolithography, impact printing, such as screen printing, gravure printing, flexo printing and offset printing, non-impact printing, such as ink-jet printing, thermal dye diffusion transfer, laser marking, electrodeposition etc.

In photolithography, the above composition is applied over an appropriate substrate by means of a known method, such as spin coating, spraying, dip coating or the like, followed by application of electromagnetic irradiation, such as UV-, visible-, electron-, neutron- or X-ray irradiation and upon necessity, heat.

The kind of electromagnetic irradiation to be applied is chosen according to the resin, polymer or prepolymer of component (b) contained in the composition.

If the resin, polymer or prepolymer of component (b) is a positive or negative resist, then UV- or visible light is used. If the resin, polymer or prepolymer of component (b) is a positive or negative UV resist, then UV light is used. If the resin, polymer or prepolymer of component (b) is a positive or negative X-ray resist, then X-ray is used. If the resin, polymer or prepolymer of component (b) is a positive or negative electron resist, then electron- or neutron beam is used. If the resin, polymer or prepolymer of component (b) is a photopolymerizable system, then UV- or visible light is used.

The above irradiation is carried out at a conventionally used power and dose, and if necessary, heat is applied subsequently.

The irradiation with electromagnetic light, such as UV- or visible light, or X-ray, or with beams of particles, such as electron- or neutron beams, is usually carried out through an appropriate mask or pattern so as to obtain desired structured color images. Details of such masks or patterns are described, for example, in A. Reiser, Photoreactive Polymers, John Wiley & Sons, New York, 1989.

If laser is used as a UV- or visible light source, no mask is necessary because pattering is achieved by scanning the laser light (Direct Overwrite Technique).

In impact-printing and ink-jet printing, the above composition is transferred to the substrate by screen transfer, flexo transfer, offset transfer, gravure transfer or ink-jetting, followed by application of electromagnetic irradiation, such as UV-, visible-, electron-, neutron- or X-ray irradiation. The criteria for the choice of electromagnetic irradiation are the same as those above. In these methods, no mask or pattern is needed since the composition is transferred to the substrate according to predetermined patterns. If necessary, heat is applied after exposure to electromagnetic irradiation.

In flexo printing, gravure printing and offset printing, it is also possible to transfer the composition after curing. In this method, the composition on a blanket or the like before transfer is exposed to electromagnetic irradiation as above and then transferred to the substrate. Since the composition is hardened in this process, polymer pattern or image layer having sharp image edges are obtained. It is preferred that the substrate is coated with an adhesive polymer so that the cured composition can easily be transferred.

In electrodeposition, the above composition is transferred by electrophoreses or micellar deposition onto the surface of patterned ITO (indium-tin-oxide) electrode formed on the surface of a substrate, followed by application of electromagnetic irradiation as above. The choice of the electromagnetic irradiation is made in the same manner as above. If necessary, heat is applied after exposure to electromagnetic irradiation.

Step (2) is carried out by applying chemical means, heat or electromagnetic irradiation such as UV-, visible-, electron-, neutron-, laser- or X-ray irradiation or a combination thereof to the above prepared polymer pattern or image layer. Preferably laser irradiation is used in this step (2), enabling the most preferred alternative of computer guided laser marking.

For this purpose, in step (1), a substrate is coated with the above composition using spin coating, dip coating or spray coating or the like, followed by application of electromagnetic irradiation, such as UV-, visible-, electron-, neutron- or X-ray irradiation, but without using any mask or pattern, to homogeneously cure the resin, polymer or prepolymer contained in the composition, followed by step (2) using the above laser. The choice of appropriate electromagnetic irradiation is made in the same manner as described above. If necessary, heat is applied after exposure to electromagnetic irradiation.

If the resin, polymer or prepolymer of component (b) contained in the composition is thermally curable, concomitant formation of patterns on the substrate and local regeneration of pigment from its precursor is possible for example by using a NIR laser. It is preferred that a near infrared absorber is contained in the above composition so that laser quantum energy is efficiently transformed to thermal energy. Although no step of development is mentioned, it may be added according to the application, as in the application to the fabrication of color filters for LCDs. In such a case, conventionally used developers and procedures are applied.

Upon irradiation with electromagnetic light or beams of particles, or application of heat or chemical means in step (2), nano-sized pigment particles are generated in situ, accompanied by a drastic color change, so that formation of pigment-based structured color images with the resolution of 0.5 $\mu$m is possible.

The above described method is of wide scope of application, and therefore, can be applied variously to optical- and thermal printing and -recording as well as the fabrication of color filters for LCDs or the like, with higher transparency, higher contrast ratio, higher color purity and strength, higher pattern resolution and precision of image, no (dye) color mixing, no clogging of sieves during purification of color/polymer mixtures, smoothness of image surface, higher registration accuracy, higher sharpness of image edges, higher thermal, chemical and light stability, and easy production of ultra thin films.

Moreover, since the pigment precursors of the present invention are in general fluorescent, reading out of the recorded information can be achieved not only based on the regenerated pigment, but also based on the fluorescence changes of the pigment precursors and the regenerated pigment remaining in the image forming layer, offering a wider scope of applications of the present invention.

In a further aspect of the present invention, there is provided a method for fabricating a color filter for LCDs including the step of pattern dyeing of a transparent conducting or nonconducting substrate with insoluble pigment particles locally generated from soluble precursors already incorporated into the pattern layer.

The above method in general includes the steps of
(1) forming a polymer layer containing dissolved pigment precursor on a transparent substrate using a composition comprising components (a), (b) and optionally (c), and
(2) locally regenerating the pigment from the above soluble precursor by chemical-, photolytical- or thermal means, or by laser or other sources of irradiation, or a combination thereof; and
(3) repeating the above steps (1)–(2) three times with changing pigment precursor so that colored patterns of blue, green and red are obtained.

Since the fabrication of color filters for LCDs is a process of producing structured color images, the above described method for producing colored patterns or images can be directly applied, but repeating three times with changing pigment precursors so as to obtain color patterns of blue, green and red on the same substrate.

The steps (1) and (2) are the same as those of the method for producing colored patterns or images.

Accordingly, photolithography, impact printing, such as screen printing, flexo printing, gravure printing and offset printing, non-impact printing, such as electrodeposition, ink-jet printing, laser marking and other techniques can be applied for embodying the method. A preferred embodiment is the fabrication of color filters for LCDs via laser marking.

Photolithography includes single-layer process and double layer process.

In single layer process, coated ITO (indium-tin-oxide) as the above transparent substrate is coated with the composition as above containing precursor of blue, green or red pigment and a resist, followed by electromagnetic irradiation through an appropriate mask or pattern to achieve structure patterning in step (1). In step (2), pigment regeneration from the pigment precursor is carried out, and upon necessity, the portion of the composition in which pigment is not regenerated is removed by using an appropriate developer. In steps (1) and (2), mosaic- or stripe-like colored patten is obtained. This process is repeated three times with changing pigment precursor so as to fabricate a color filter of blue, green and red colors.

In double layer process, coated ITO as the above transparent substrate is coated with the composition as above containing precursor of blue, green or red pigment and a thermo-setting prepolymer, which is further coated with a colorless resist, followed by electromagnetic irradiation through an appropriate mask or pattern to achieve structure patterning in step (1). In step (2), pigment regeneration from the pigment precursor and crosslinking of pigmented prepolymer are carried out, and the top resist layer is removed using an approriate developer. In steps (1) and (2), mosaic- or stripe-like colored pattern is obtained. This process is repeated three times with changing pigment precursor so as to fabricate a color filter of blue, green and red colors.

In impact printing method, the composition as above is transferred in the desired pattern to the transparent substrate, which is exposed to electromagnetic irradiation or heat to achieve structure curing in step (1). Herein, if the composition is cured before transfer in gravure printing, flexo printing or offset printing, the composition does not need to be exposed to electromagnetic irradiation. Pigment regeneration is carried out in step (2), wherein no development is necessary because the ITO is coated with the composition only at desired positions. This process is repeated three times with changing pigment precursor so as to fabricate a color filter of blue, green and red colors.

In the laser marking method, the transparent substrate is coated with the composition as above, and upon necessity, followed by exposure to electromagnetic irradiation or heat in step (1). The pigment regeneration in step (2) is achieved by using a computer-guided laser equipment. If the resin, polymer or prepolymer contained in the composition is a thermally curable resin, concomitant patterning and regeneration of pigment is possible in step (1) and (2). This process is repeated three times with changing pigment precursor so as to fabricate a color filter of blue, green and red color.

In the electrodeposition method, the composition as above is transferred onto the surface of patterned ITO as the above transparent substrate by electrophorese, micellar deposition or the like, followed by exposure to electromagnetic irradiation or heat in step (1). Pigment regeneration is carried out in step (2), wherein development is not necessary. This process is repeated three times with changing pigment precursor so as to fabricate a color filter of blue, green and red color.

In order to achieve the desired image formation, in certain applications it may not be necessary to use the aforementioned component (b) of the instant compositions. In such cases any kind of known high molecular weight organic binder material may be used as component (b'), said binder material fullfilling the function of appropriately fixing instant component (a), the soluble pigment precursor, on the substrate on which a colored pattern or image should be produced.

Accordingly, a further subject of the invention is a method for producing colored patterns or images including the steps of (1) forming a polymer layer containing a dissolved pigment precursor component (a), a high molecular weight organic binder material (b') and optionally (c), and (2) locally regenerating the pigment from the above soluble precursor by chemical, photolytical or thermal means, or by laser or other sources of irradiation.

Examples of appropriate high molecular weight organic binder materials are polymers based on vinyl compounds, such as polystyrene, poly-α-methylstyrene, poly-p-methylstyrene, poly-p-hydroxystyrene, poly-p-hydroxyphenylstyrene, polyacrylates such as poly(methyl acrylate), poly(acrylamide) and the corresponding methacrylic compounds, poly(methylmaleate), poly (acrylonitrile), poly(methacrylonitrile), poly(vinyl chloride), poly(vinyl fluoride), poly(vinylidene chloride), poly(vinylidene fluoride), poly(vinyl acetate), poly(vinyl alcohol), poly(methylvinylether) and poly(butylvinylether);

polyesters such as particularly polyethylene terephthalate, polycarbonates, polyolefins such as polyethylene and polypropylene, and polyalkadienes such as polybutadiene;

or copolymers of two or more of these compounds such as ABS or poly(vinyl chloride/vinyl acetate/vinyl alcohol);

novolacs derived from a $C_1$–$C_6$-aldehyde, e.g., formaldehyde and acetaldehyde, and a dinuclear, preferably mononuclear, phenol which may optionally be substituted by one or two $C_1$–$C_9$-alkyl groups, by one or two halogen atoms or by one phenyl nucleus, such as o-, m- or p-cresol, xylenol, p-tert.butylphenol, o-, m- or p-nonylphenol, p-chlorophenol or p-phenylphenol, or those with more than one phenolic group, such as resorcin, bis-(4hydroxyphenyl)methane or 2,2-bis-(4-hydroxyphenyl)propane;

polymers formed from maleimides and/or maleic anhydrides, for example, copolymers from maleic anhydride and styrene;

poly(vinyl pyrrolidon);

biopolymers and their derivatives, such as cellulose, starch, chitin, chitosan, gelatine, zein, cellulose derivatives, for example ethylcellulose, nitrocellulose, celluloseacetate and cellulosebutylate;

and natural and synthetic resins, such as rubber, waxes, casein, silicon, silicone resins, urea- and melamine-formaldehyde resins, alkyd resins, phenolic resins, polyamides, polyaramides, polyimides, polyamide/imides, polysulfones, polyethers such as polyphenylene oxides, polybutyral, polyethersulfones, polyurethanes, polyureas, polyarylenes, polyarylenesulfides, epoxy resins such as polyepoxides.

Preferred binder materials (b') are polymers based on vinyl compounds, novolacs, biopolymers, polyimides, polyesters, polycarbonates, polybutyral and mixtures thereof.

There are different ways to perform step (1) of forming a polymer layer containing a dissolved pigment precursor component (a), a high molecular weight organic binder material (b') and optionally (c). One way is for example to use a composition containing all the desired components. Another is to prepare a receiver layer containing no pigment precursor (a), onto which the pigment precursor (a) is applied afterwards for example by ink-jetting an ink containing the pigment precursor (a) or preferably by thermal dye diffusion transfer from a donor material containing the pigment precursor (a).

Thermal dye diffusion transfer is a technology not to be confused with technologies based on mordants or chemical reactivity, where silver compounds (like in instant photography where a thermal development may be included) or colour formers (for example lactones which need a reactive partner—usually an acid or a phenol—in the receiver) are involved, though scientists still disagree on the terminology or use it improperly. A description can be found for example in Spec. Publ.—R. Soc. Chem. 133/pp. 73–85 (1993), Proc. SPIE—Int. Soc. Opt. Eng. 1912/pp. 252–260 (1993), Nippon Shashin Gakkaishi 55(6)/pp.—456–464 (1992), Journal of Imaging Technology 16(6)/pp. 238ff (1990) and many other publications.

The principle of thermal dye diffusion transfer is the following: a thin donor sheet (usually 1–10 μm) containing the dye is brought in contact with a receiver material, then heat is generated in a way such that the desired quantity of dye transfers to selected target areas. This can be achieved by simple heating of a broad area, but usually electronically controlled thermal array heads moving across the back surface of the donor are used. Alternatively, a high-intensity light flash (EP-391303, EP-529362) through a screen or a laser source (Proc. SPIE—Int Soc. Opt Eng. 1912/p. 261 ff. [1993]) can be used; preferably a laser beam focussed onto the donor is used as an energy source; in this case, the donor layer preferably contains IR dyes which convert the light into heat, the laser is an IR laser (as in EP-529561) and extremely high resolutions can be obtained.

Thus, thermal dye diffusion transfer is a completely dry process totally under electronic control, leading as desired to continuous or full tone images in mosaic pixel patterns, such as needed for electronic photography printouts, color proofing and especially colour filters for LCD's.

The present soluble pigment precursors (a) are known to decompose thermally at temperatures below 200° C., for example N,N'-bis-tert.-butoxycarbonyl-1,4-diketo-3,6-diphenyl-pyrrolo-[3,4-c]pyrrole starts to decompose at 150° C. (peak at 175° C.) and is totally converted to 1,4-diketo-3,6-diphenyl-pyrrolo-[3,4-c]pyrrole in less than 10 min at 180° C. In thermal dye diffusion transfer, the temperature raises well above the glass transition point of the receiver; practically, printers work at temperatures above 230° C., typically the surface of the thermal head reaches 350° C. Thus, it had to be expected that upon printing the pigment precursors (a) would decompose within the donor, what would inhibit their transfer to the receiver; but highly surprising, it has now been found that they can be transferred thermally without any apparent decomposition.

Accordingly, further subjects of this invention are methods for producing colored patterns or images including the steps of (1) forming a polymer layer containing a dissolved pigment precursor component (a), a high molecular weight organic binder material (b') and optionally (c), and (2) locally regenerating the pigment from the above soluble precursor by chemical, photolytical or thermal means, or by laser or other sources of irradiation, where step (1) is accomplished by:

forming a polymer layer containing dissolved pigment precursor using a composition comprising component (a) and (b') a high molecular weight organic binder material and optionally (c), (1a) forming a polymer layer containing a high molecular weight organic binder material (b') and optionally (c), then (1b) ink-jetting an ink comprising a pigment precursor (a) onto the polymer layer in selected target areas, or (1a) forming a polymer layer containing a high molecular weight organic binder material (b') and optionally (c), then (1b) superposing a donor layer comprising a pigment precursor (a) and a high molecular weight organic binder material (b') onto the polymer layer, (1c) locally heating the donor layer to transfer the dye in selected target areas, and (1d) removing the donor layer from the receiver layer.

All the aforementioned embodiments described above for using instant components (a) in a method for producing colored patterns or images also pertain to the corresponding method where components (b') are used instead of components (b).

All the aforementioned embodiments described above for using instant components (b) in a method for producing colored patterns or images generally also pertain to the corresponding method where components (b') are used instead of components (b), as long as the compositions of step (1) are prepared by forming a polymer layer containing dissolved pigment precursor using a composition comprising component (a) and (b') a high molecular weight organic binder material and optionally (c).

When the compositions of step (1) are prepared by ink-jetting an ink comprising a pigment precursor (a) onto a polymer layer in selected target areas, preferably the polymer layer is poly(vinyl alcohol) and the ink comprises 0.5 to 10% of the pigment precursor (a) in a hydrophilic solvent; most preferably, the ink consists essentially of 1 to 5% of the pigment precursor (a) in a polar solvent mixture comprising ethylene glycol or diethylene glycol.

When the compositions of step (1) are prepared by thermal dye diffusion transfer from a donor layer comprising a pigment precursor (a) onto a polymer layer in selected target areas, preferably the receiver polymer layer is polyester, poly(vinyl chloride/vinyl acetate), polycarbonate or a mixture thereof, the donor layer contains 1 to 10% of the pigment precursor (a) in a different binder and the binders used for the donor and receiver layers are different; most preferably, the receiver polymer layer is coated as a 10 to 20 wt % solution and contains 0.1 to 5 wt % of surfactants, and the donor's binder consists essentially of polybutyral or cellulose derivatives. Further details concerning the donor's and receiver's preferred chemical compositions are well-known to specialists and are subject of many patents and other publications (such as in EP-507734 and EP-508954). The donor may be re-used many times, and the relative motion of donor and receiver may be varied, for example in order to increase the colour intensity. Usually, the donor is just peeled off after the transfer step, but it may be useful in some cases to remove it partially or totally by chemical dissolution.

Polymeric layers containing dissolved pigment precursor components (a), high molecular weight organic binder materials (b') and optionally (c) have similar properties as positive or negative resist-type resins, polymers or prepolymers (b) after structuration and may be used in replacement.

Accordingly, the present invention provides a method for fabricating a color filter for LCDs including the step of pattern dyeing of a transparent conducting or nonconducting substrate with insoluble pigment particles locally generated from soluble precursors already incorporated into the pattern layer.

The above method in general includes the steps of (1) forming a polymer layer containing a dissolved pigment precursor component (a), a high molecular weight organic binder material (b') and optionally (c), (2) repeating the above step (1) three times with changing pigment precursor so that colored patterns of blue, green and red are obtained in step (3), and (3) locally regenerating the pigment from the above soluble precursor by chemical-, photolytical- or thermal means, or by laser or other sources of irradiation, or a combination thereof.

EXAMPLES

Example 1A 27.94 g di-tert.-butyl-dicarbonate is added in 3 portions at 1 hour time interval to a mixture of 3.23 g 4-dimethylaminopyridine and 14.75 g 1,4-diketo-3,6-diphenyl-pyrrolo-[3,4-c]pyrrole in 500 ml of tetrahydrofurane dried over molecular sieves. The resulting red suspension is stirred at room temperature for 2 hours in a dry atmosphere until a green solution is obtained. The solvent is evaporated under reduced pressure and the yellow residue washed with 5% aqueous sodium bicarbonate solution and with water, then dried unter vacuum. 24.5 g N,N'-bis-tert.-butoxycarbonyl-1,4-diketo-3,6-diphenyl-pyrrolo-[3,4-c]pyrrole (DPP-BOC) is obtained.

$^1$H-NMR ($\delta$, CDCl$_3$): 1.40 (s,18H); 7.48–7.50 (m,6H); 7.75 (d,4H)

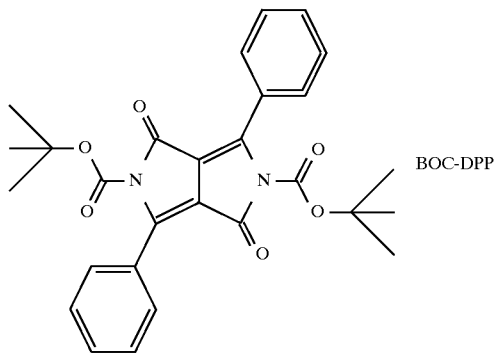

Example 1B

Pyrrolopyrroles-butoxycarbonyl for Color Image Application

A formulation containing 2.00 g of poly-p-hydroxystyrene (PHM-C, Maruzen), 0.80 g of N,N'-bis-tert.-butoxycarbonyl-1,4diketo-3,6-diphenyl-pyrrolo-[3,4-c]pyrrole (BOC-DPP) from example 1A, 466 mg of a melamine crosslinker (Cymel 303), 106 mg of i-line photo acid former 4-methoxy-α-((((4-methylphenyl)sulfonyl)oxy)imino)-benzeneacetonitrile as shown below and 8.00 g of cyclopentanone is prepared (formulation 1).

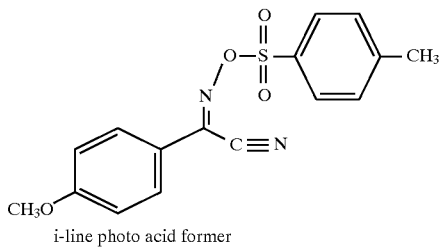
i-line photo acid former

Another formulation containing 2.00 g of poly-p-hydroxystyrene (PHM-C, Maruzen), 472 mg of freshly milled, dispersed 1,4-diketo-3,6-diphenyl-pyrrolo-[3,4-c]pyrrole, 466 mg of melamine crosslinker (Cymel 303), 106 mg of i-line photo acid former as above and 8.00 g of cyclopentanone is prepared (formulation 2) as a comparative sample.

Each of the above formulations is spin-coated on a 3-inch silicon wafer or a 1-inch quarz wafer at a rotation of 4000 rpm, followed by drying on a hot plate at 100° C. for 60 seconds. The films obtained from formulation 1 are clear and pale yellow colored, and show a smooth surface, while those obtained from formulation 2 are turbid and show rough surface. The films obtained from both of formulations 1 and 2 are irradiated using a mercury vapour lamp through a 365 nm interference filter and a chromium-quarz mask at a power of 50 mJ/cm$^2$. The films are then heated on the hot plate at 120° C. for 60 seconds and developed for 20 seconds in OPD 262 (2.38% aqueous solution of tetramethylammonium hydroxide). The films from formulation 1 are subsequently heated at 150°–200° C. for 15–120 seconds (sample A: 30 sec. at 170° C., sample B: 30 sec. at 195° C., and sample C: 120 sec. at 150° C.).

Structuring is possible for both of the formulations 1 and 2. However, while the films from formulation 1 allow structuring without any residue and permit a resolution of as high as 0.5 μm, formulation 2 does not allow any residue free resolution of higher than ca. 50 μm.

The color intensity of films from formulation 1 and 2 are similar. But, while the films from formulation 1 are clear by visual observation, those from formulation 2 are turbid. Furthermore, no pigment cluster is recognized by raster electron microscope in the films from formulation 1.

In addition, it is possible to form a plurality of overlapping film layers, wherein no interaction of the upper, new layer with the already existing, under layer is recognized.

Example 2

Laser Direct Write Technique

The above formulation 1 is spin-coated on a silicon disk and dried, whereby a film having a thickness of 1.4 microns is obtained. This film is then irradiated line forming-wise using an argon laser at 364 nm (distance: 85 mm, power: 0.30 nW, and irradiated area per second: 0.6 mm$^2$), heated at 120° C. for 1 minute, developed in a 2.38% aqueous solution of tetramethylammoniun hydroxide and finally heated at 170° C. for 1 minute.

A red film remains at positions which are overwritten with the laser, and the other zones are removed by the developer. The resolution is of order of 20 μm.

Example 3

Generation of Fluorescence Pattern by Irradiation

A solution composed of 2.00 g of polystyrene (Aldrich, M$_w$=280,000), 500 mg of N,N'-bis-tert.-butoxycarbonyl-1, 4-diketo-3,6-diphenyl-pyrrolo-[3,4-c]pyrrole of example 1A and 125 mg of triphenylsulfoniumtriflate, dissolved in 10 g of cyclopentanone, is spin-coated on a 1-inch quarz wafer. After drying at 100° C. for 60 seconds, a homogeneous film of 1.2 μm in thickness is obtained. This film is irradiated picture-wise through a chromium-quarz mask (30 mJ/cm², 254 nm) and then heated at 130° C. for 60 seconds, whereby intensive red-coloring appears at the zones irradiated previously, with which the fluorescence behaviour changes. The thus obtained fluorescence pattern has resolution of as high as 0.5 μm. In contrast to this, no change is observed, i.e., the film remains pale yellow, in the zones which are not irradiated.

Example 4

Indigo-butoxycarbonyl for Color Filter Application

A solution analogous to the formulation 1 of example 1B is prepared, wherein the butoxycarbonyl-modified indigo as shown below is used instead of N,N'-bis-tert.-butoxycarbonyl-1,4-diketo-3,6-diphenyl-pyrrolo-[3,4-c]pyrrole.

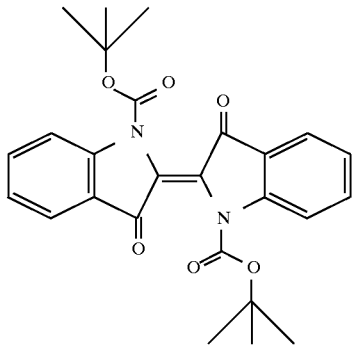

After spin-coating on a quarz wafer, a 1.2 μm thick, orange film is obtained. The processing is carried out analogously to that described above for the diketopyrrolopyrrole. The irradiated resist zone is colored blue and remains on the substrate after development.

Example 5

Thermal Recording Technique

A thermal recording foil is prepared by casting a 200 μm thick film consisting of a solution of 2.0 g of polystyrene, 200 mg of BOC-DPP and 100 mg of dibenzylphenyl sulfonium hexafluoro antimonate, dissolved in 5 g of chlorobenzene, on a 3M PP 2500 overhead foil. After air-drying for 6 hours the polystyrene film containing the latent pigment is about 70 μm thick and tackfree.
This thermal recording foil is then irradiated with an argon laser (15 mm out of focus, 488 nm single, 100 mW) with writing speed of 100, 50 and 25 mm/sec. For all speeds a clearly visible, orange image is created immediately after the laser write. The intensity of the orange color is dependent on the writing speed of the laser and is most intense at the lowest speed.

Example 6

Thermal Recording Technique

A thermal recording foil is prapared analogously to,example 5, but with a film which does not contain the sulfonium salt. The foil is irradiated with an argon laser (in focus, 488 nm single, 100 mW, 50 mm/sec). The zones which have been irradiated with the laser turn orange immediately after the laser write.

Example 7

A formulation composed of 1.8 g novolak (28% p-cresol, 78% m-cresol, Mn=1700, Mw=8895), 0.24 g melamine crosslinker (cymel 303), 0.50 g bisphenol-A, 65 mg photo acid former from example 1, and 0.70 g of latent pigment LPR 177, dissolved in 8.4 g cyclopentanone, was prepared.

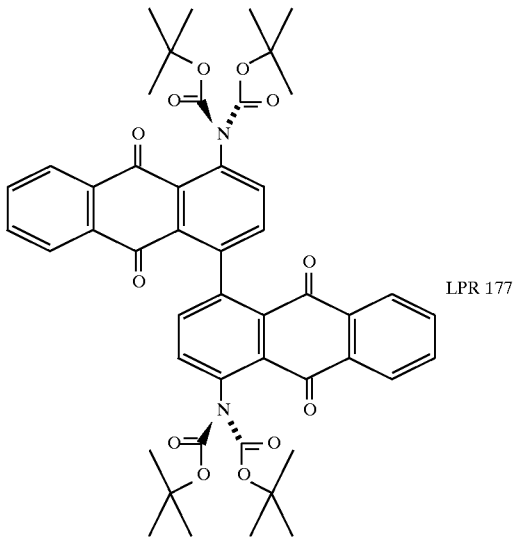

LPR 177

The formulation was spin-coated on a 7.5×7.5 cm Corning 7059 type glass substrate (2000 rpm) and dried on a hot-plate at 100° C. for 60 seconds. The resulting film is irradiated with a dose of 30 mJ/cm² as in example 1B. The film was then heated on the hot plate for 60 seconds at 120° C. and subsequently developed for 60 seconds in 1N aqueous NaOH developer, leaving behind structures which form a negative tone image of the mask. The glass substrate containing the micropatterns is finally baked at 150° C. for 2 hours, yielding highly transparent micropatterns of red color.

Example 8

A formulation is prepared by dissolving 1.0 g of a copolymer of methacrylic acid and benzylmethacrylate (obtained by free radical induced polymerization (AIBN, toluene, 20 hours at 70° C., Mn=8500, Mw=35000) of the corresponding monomers, 0.7 g dipenta-erythritol-monohydroxy-pentaacrylat (SR 399 from Sartomer Inc.), 0.2 g of LPR 177 and 0.1 g Irgacure 369 (Ciba-Geigy Inc.), dissolved in 7 ml 1-methoxy-2-propyl-acetate. The formulation is spin-coated on 1 inch quartz wafers and dried on a hot-plate for 60 seconds at 100° C. The resulting films are exposed as in example 1 with a dose of 70 mJ/cm² and subsequently developed for 60 seconds in OPD 262 developer, yielding micropatterns which form a negative image of the mask. The quartz wafers are then heated for 2 hours at 150° C., leading to colored microstructures.

Example 9

A formulation is prepared analogously to example 7, but latent pigment LPV 353 is used instead of LPR 177, and the materials are dissolved in 12 ml cyclopentanone. This formulation is imaged in the same way as in example 7, leading to micropatterns of violet color.

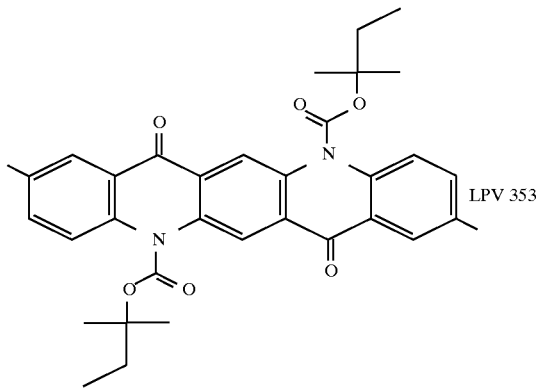

Example 10A 0.07 g 4-dimethylaminopyridine is added to a mixture of 0.37 g C.I. Pigment Yellow 139 and 1.64 g di-tert.-butyl-dicarbonate in 20 ml of N,N-dimethylformamide dried over molecular sieves. The resulting orange-coloured suspension is stirred at room temperature for 7 days, then poured into 60 ml of water unter cooling and good stirring for 30 min. The crude filtration residue is treated with 10 ml of methanol and filtered to remove the insoluble part. 50 ml of water are then added to the filtrate. The precipitate is collected and dried at room temperature unter vacuum. 0.50 g product is obtained, which consist of a mixture of components of idealized formula (LPY 139).

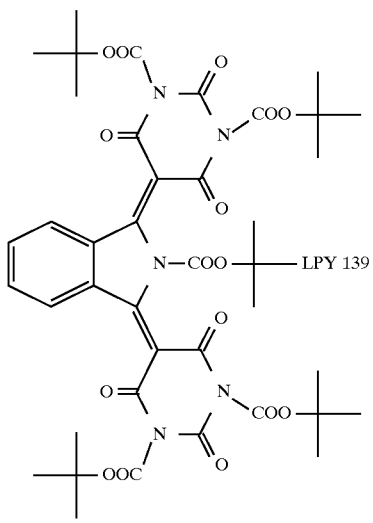

Determined by thermogravimetric analysis (sudden weight loss at 180° C.), the number of tert.-butyloxycarbonyl groups is 4.3, showing the desired partial reaction.

Example 10B

A formulation is prepared and processed analogously to example 7, but the crude product from example 10A is used instead of LPR 177, leading after a final baking step at 150° C. for 2 hours to microstructures of yellow color.

Example 11

A formulation is prepared and processed analogously to example 7, but 1.1 g LPY 139 and 1.1 g LPV 353 are used instead of 2.2 g LPR 177, leading after a final baking step at 150° C. for 2 hours to micropatterns of violet color.

Example 12

A formulation consisting of 1.6 g polystyrene (Aldrich, 18,242- 7, Mw=280'000), 0.4 g BOC-DPP, 0.1 g triphenyl-sulfonium triflate and 8.0 g cyclopentanone was prepared. This formulation was spin-coated onto a 1 inch quartz wafer (2500 rpm) and dried on a hot plate for 1 minute at 100° C., yielding a homogeneous yellow film. This wafer is then irradiated through a mask analogously to example 1 and finally heated for 2 minutes at 135° C. The zones of the film which have been irradiated turned red, whereas the unirradiated zones stayed yellow, generating highly resolved (submicrometer resolution) color patterns of the mask in the film.

Example 13

Films on quartz disks were prepared analogously to example 12. These films were irradiated with a laser analogously to example 5 (laser speed 250 mm/sec) and subsequently tempered at 135° C. for 1 minute. Analogously to example 12, the irradiated zones turned red, whereas the nonilluminated zones remained yellow.

Example 14A

Thermal Dye Diffusion Transfer

The following substances are introduced into a 5 ml pill bottle:

| | |
|---|---|
| 500 mg ® Vylon 600 | linear high molecular weight polyester (Toyobo) |
| 25 mg ® KF-393 | amino-modified silicone (Shinetsu) |
| 25 mg ® X-22-343 | epoxy modified silicone (Shinetsu) |
| 55 mg p-toluene sulfonic acid | acidic catalyst |
| 1531 mg methyl ethyl ketone | p.a. (Merck) |
| 1531 mg toluene | p.a. (Merck) |

The bottle is sealed with a polyethylene stopper and then mechanically agitated at room temperature (20° to 25° C.) for 14 hours. The solution obtained is then cast with a 24 μm draw bar onto a film of white polyethylene terephthalate ®U-6 (Teijin) at 12 cm/s speed.

The fresh casts are dried at 20° to 25° C. for 24 hours, then heated at 150° C. in an oven for 30 minutes; finally, rectangles of 110×132 mm in size are cut out of the central portions to obtain ready-to-print receiver sheets.

116 mg N,N'-bis-tert.-butoxycarbonyl-1,4diketo-3,6-diphenyl-pyrrolo-[3,4-c]pyrrole and 105 mg poly-(vinyl butyral) are dissolved in 1.35 g toluene, 1.35 g methylethylketone and 100 mg ethanol in a 5 ml pill bottle sealed with a polyethylene stopper by mechanical agitation at room temperature (20° to 25° C.) for 14 hours. The solution obtained is then cast with a 12 μm draw bar onto a 6 μm thick film of heat-resistant transparent polyethylene terephthalate at a linear speed of 12 cm/s. The fresh casts are sequentially dried at 50° C. for 3 minutes and 80° C. for 5 minutes, then rectangles of 103×190 mm in size are cut out of the central portions and mounted with tape into ®SV-100 (Kodak) colour printing cassettes instead of the original yellow film portions to give ready-to-print donor ribbon.

Prints with uniformly coloured, yellow areas corresponding to the relative print intensities 0 (minimum density), 26, 51, 77, 102, 128, 153, 179, 204, 230 and 255 (maximum density) are then made on an ®SV-6550 Color Video Printer (Kodak) using the receiver and donor described above. Digitally stored images are used for this purpose.

The optical density "$D_0$" of the bright yellow step-wedge patterns which are obtained is determined on a ®TR924 Macbeth densitometer by reflectance measurements with status A filters (blue, green and red channels). The CIELAB calorimetric coordinates are measured on an ®Elrepho 2000 D65/10° (Datacolor) instrument.

The patch of maximal intensity has a blue reflectance density of 1.08, a green reflectance density of 0.02 and colorimetric coordinates of L*=101.40, a*=−28.2 and b*=87.3.

Example 14B

The yellow print of example 14A is gradually heated up to finally 150° C. for 15 minutes. A colour change to orange-red is observed. The patch of maximal intensity has a blue reflectance density of 0.56, a green reflectance density of 0.82 and colorimetric coordinates of L*=65.95, a*=47.6 and b*=9.3.

Example 14C

The samples are tested for their fading resistance through irradiation under window glass in an Atlas Ci35 with a light intensity of 80 kLux until the desired exposure energy level of xx kJ/cm$^2$ is reached. Then the optical density $D_{channel}^{xx}$ is determined for the blue, green and/or red channel and the ratio $[(D_0-D^{xx})/(D_0 \times 0.01)]$ is used to determine the degree of fading $-DD_{channel(D_0)}^{xx}$ in % given an initial density of $D_0$ before exposure.

The unheated yellow print of example 14A and the orange-red print of example 14B heated at 150° C. for another 15 minutes are irradiated until the exposure energy level of 60 kJ/cm$^2$ is reached. The yellow print of example 14A fades almost immediately and completely ($-DD_{blue(0.5)}^{15}$=96%), while the orange-red print of example 14B almost immediately turns red as residues of N,N'-bis-tert.-butoxycarbonyl-1,4-diketo-3,6-diphenyl-pyrrolo-[3,4-c] pyrrole fade, then does not change significantly anymore ($-DD_{green(0.5)}^{60}$=8%), due to the excellent lightfastness of the transparent 1,4-diketo-3,6-diphenyl-pyrrolo-[3,4-c] pyrrole pigmentary form.

Example 15A

Bar coatings are made as in example 14A, but with ®UCAR VAGH (Union Carbide) vinyl resin instead of ®Vylon 600 polyester resin. The dry casts are heated at 120° C. in an oven for 15 minutes and cut as above to obtain ready-to-print receiver sheets. Prints are then made using identical donor and printing conditions as in example 14A. Bright yellow step-wedge patterns are obtained.

Example 15B

The yellow print of example 15A is heated at 120° C. for 25 minutes. A color change to orange-red is observed like in example 14A.

Examples 16–20

It is proceeded in analogouslyy to example 14, with the difference that the samples are directly heated 50° C. for 25 minutes, with the formulations and the results shown below:

| example | catalyst | | $D_{green}$ (after heating) |
|---|---|---|---|
| 16 | 55 mg | H$_3$C—C$_6$H$_4$—SO$_3$H | 1.16 |
| 17 | 55 mg | HO—CH$_2$CH(OH)—SO$_3$H | 1.09 |
| 18 | none | | 0.38 |
| 19 | 27 mg | triphenylsulfonium PF$_6^-$ | 0.78 |
| 20 | 55 mg | (anthracenyloxy-hydroxypropyl)diphenylsulfonium SbF$_6^-$ | 1.18 |

Examples 21–23

It proceeded in analogy to example 15, with the formulations and the results shown below:

| example | catalyst | | $D_{green}$ (after heating) |
|---|---|---|---|
| 21 | 55 mg | H$_3$C—C$_6$H$_4$—SO$_3$H | 1.21 |
| 22 | 27 mg | HO—CH$_2$CH(OH)—SO$_3$H | 0.54 |
| 23 | 55 mg | HO—CH$_2$CH(OH)—SO$_3$H | 1.08 |

What is claimed is:

1. A composition for making a patterned color image comprising
    (a) a pigment precursor which is dissolved in said composition and which can be transformed into a pigment which is insoluble in the color image by the action of an acid or base or by heating to a temperature of 130°–200° C. or electrornagnetic irradiation, or a combination thereof; and
    (b) a positive or a negative photoresist, which is made from a resin, polymer or prepolymer, and the structure of which can be modified by crosslinking, polymerization or depolymerization by applying UV or visible light, alone or in combination with heating to a temperature up to 120° C.

2. A composition according to claim 1, wherein said component (b) is selected from the group consisting of diazoquinone resists based on phenolic resins; dichromated polymers; polymers having crosslinking groups in side chains; water processable resists; polymeric styrylquinolinium salts; acrylic copolymers having dimethylmaleimide as a side chain; substituted poly(vinyl alcohol) containing diphenylcyclopropene as a side chain; polymers having azido groups; bis-azide resists based on poly(cis-isoprene) and bis-azides water processable azido resists based on poly(acrylamide) or poly(vinylpyrrolidone) and water soluble bis-azides; azide resists based on poly(vinyl phenol)

and mono-azides; poly(vinyl alcohol) or poly(vinylpyridine) to which a bifunctional acylsilane is added; photocrosslinking copolymers of vinyl benzophenone and 4-dimethylaminostyrene; photoreactive polyimides; diazoresins compositions comprising photopolymers and monomers, crosslinkers, binders, fillers, initiators and/or stabilizers; polyfunctional prepolymers having acrylic functional groups in side chains; modified diazoquinone resists selected from those based on novolacs and diazopyrazolidine dione, diazotetramic acid, diazopiperidine dione or diazo-Meldrum's acid; resists based on o-nitrobenzyl esters, o-nitrobenzyl-substituted polyethers, m-poly(nitroanilide) or poly(p-acetoxystyrene); poly(methyl methacrylate) derivatives selected from 3-oximino-2-butanone methacrylate (OMMA)-MMA copolymer, OMMA-methacrylonitrile-MMA terpolymer and MMA-indenone copolymer of the formula

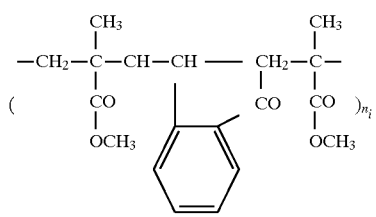

poly(methyl isopropyl ketone); polymers containing triphenylcarbonium ions in their backbones; poly(tert-butoxycarbonyloxystyrene); novolacs with carbonates and onium salts or with naphthalene-2-carboxylic acid-tert-butyl ester; copolymers of phthalaldehyde with o-nitrobenzaldehyde; bis-azide-cyclized rubber compositions containing 4,4'-diazidodipheny sulfide; bis-azide-poly(vinyl phenol) compositions containing 3,3'-diazidodiphenyl sulfone; bis-azido-poly(methyl methacrylate) compositions containing 3,3'-diazidodiphenyl sulfone; epoxides with onium salts or with n-hexyloxydiazonium hexafluorophosphate; mixtures based on poly-p-hydroxystyrene or novolacs with a melamine crosslinker with undergo crosslinking by applying heat in the presence of acid catalysts; copolymers of p-hydroxystyrene and esterified p-hydroxymethyl-styrene which crosslink in the presence of acid; urethane-blocked aromatic polyamine which undergoes crosslinking upon irradiation with light in the presence of bis-epoxides; epoxy resins which crosslink in the presence of curing agents; esters of poly(vinyl benzoic acid) which transform to poly(vinyl benzoic acid) by heating in the presence of a catalytic amount of acid; blocked poly-p-hydroxystyrenes which transform to poly-p-hydroxystyrene by heating in the presence of a catalytic amount of acid; esters of polyacrylates and polymethacrylates which transform to polyacrylic- or polymethacrylic acid by heating in the presence of a catalytic amount of acid; polycarbonates which depolymerize upon heating, and mixtures of methacrylic acid-methyl methacrylate copolymer and methacryloyl chloride-methyl methacrylate copolymer which crosslink by heating.

3. A composition according to claim 1, which in addition to components (a) and (b), also comprises (c) a catalyst for positive or negative polymer patterning and/or a catalyst for pigment formation.

4. A composition according to claim 3, wherein said catalyst (c) is an acid or base catalyst.

5. A composition according to claim 4, wherein said catalyst (c) is a latent acid or a latent base which is capable of releasing an acid o base upon exposure to actinic radiation.

6. A composition according to claim 5, wherein said catalyst is an onium salt.

7. A composition according to claim 6, wherein said onium salt is a diazonium, sulfonium, sulfoxonium or iodonium salt.

8. A composition according to claim 1, wherein said pigment precursor (a) is represented by formula I

wherein x is a number from 1 to 4,

A is the residue of a colorant of the quinacridone-, anthraquinone-, perylene-, indigo-, quinophthalone-, isoindolinone-, isoindoline-, dioxazine-, diketopyrrolopyrrole- or azo series, which is bound to x groups B via N atoms, which nitrogens are part of A, B is a group bound to A, represented by formulae

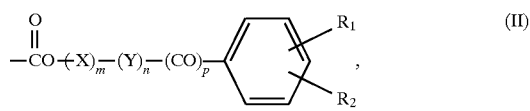

and wherein in formulae II, III and IV m, n and p are each independently of the other 0 or 1, X is $C_1$–$C_{14}$-alkylene or $C_2$–$C_8$-alkenylene, Y is a group —T—$(CH_2)_r$, Z is a group —T—$(CH_2)_r$, T is $C_3$–$C_6$cycloalkylene, q is a number between 1 and 6, r is a number between 0 and 6, $R_1$ and $R_2$ are each independently of the other hydrogen, $C_1$–$C_6$-alkyl, $C_1$–$C_4$-alkoxy, halogen, CN, $NO_2$, phenyl or phenoxy which are unsubstituted or substituted by $C_1$–$C_4$-alkyl, $C_1$–$C_4$-alkoxy or halogen, Q is hydrogen, CN, $Si(R_1)_3$, a group $C(R_5)(R_6)(R_7)$, wherein $R_5$, $R_6$ and $R_7$ are each independently of the other hydrogen or halogen and at least one of the residues $R_5$, $R_6$ and $R_7$ is halogen, a group

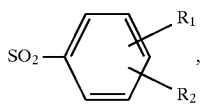

wherein $R_1$ and $R_2$ have the same meaning as given above, a group $SO_2R_8$ or $SR_8$, wherein $R_8$ is $C_1$–$C_4$-alkyl, a group $CH(R_9)_2$, wherein $R_9$ is phenyl which is unsubstituted or substituted by $C_1$–$C_4$-alkyl, $C_1$–$C_4$-alkoxy or halogen, or a group of formula

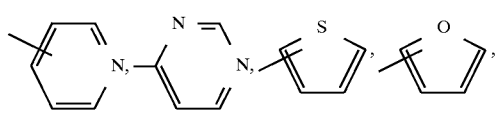

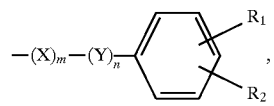

wherein X, Y, $R_1$, $R_2$, m and n have the above given meaning, or $R_3$ and $R_4$ together with the nitrogen, on which they are bound, form a pyrrolidinyl-, piperidinyl- or morpholinyl residue, and wherein $A(B)_x$ may contain additional =N—, —NH— or —NH$_2$ groups.

9. A composition according to claim 8, wherein x is 2 and B is a group of formula

-continued

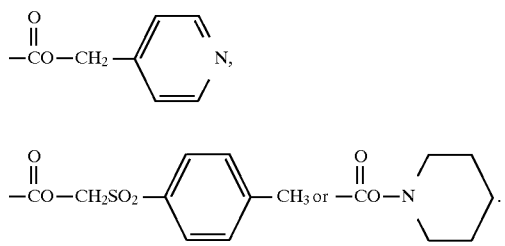

10. A composition according to claim 8, wherein the compound of formula I is

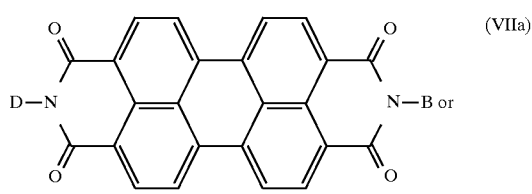

(VIIa)

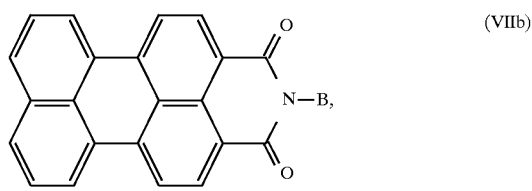

(VIIb)

wherein D is hydrogen, $C_1$–$C_6$-alkyl, phenyl, or phenetyl which are unsubstituted or substituted by halogen or $C_1$–$C_4$-alkyl, or is the same as B, and B is a group as defined in claim 8.

11. A composition according to claim 8, wherein the compound of formula I is a quinacridone of formula

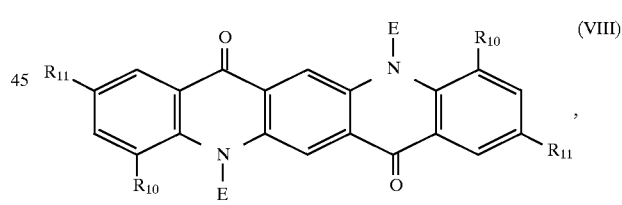

(VIII)

wherein $R_{10}$ and $R_{11}$ are each independently of the other hydrogen, halogen, $C_1$–$C_{18}$-alkyl, $C_1$–$C_4$-alkoxy or phenyl, and E stands for B, with the proviso that at least one E stands for B.

12. A composition according to claim 8, wherein the compound of formula I is a dioxazine of formula

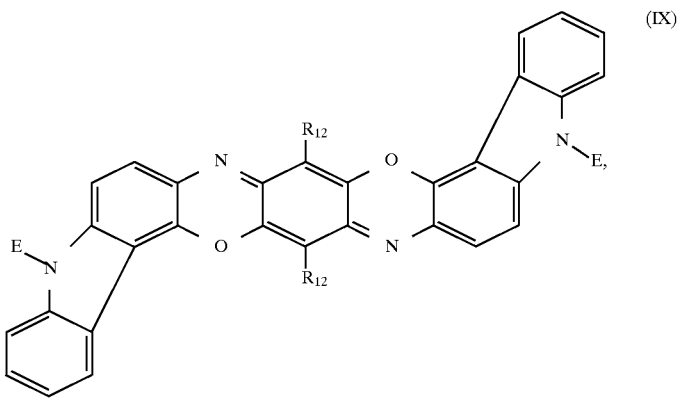
(IX)

wherein $R_{12}$ is hydrogen, halogen or $C_1$–$C_{18}$-alkyl, and E stands for hydrogen or for B, with the proviso that at least one E stands for B.

13. A composition according to claim 8, wherein the compound of formula I is an isoindoline of formula

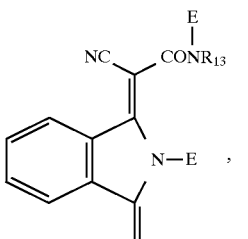
(X)

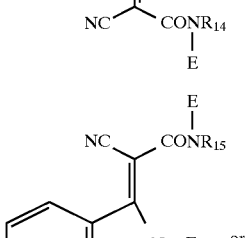
(XI)

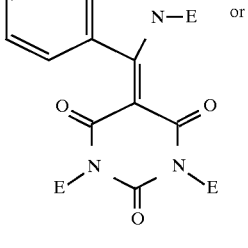

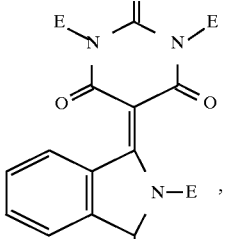
(XII)

wherein $R_{13}$ is a group

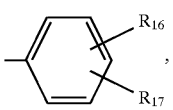, $R_{14}$ is hydrogen, $C_1$–$C_{18}$-alkyl, benzyl or a group

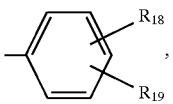, $R_{15}$ has the same meaning as $R_{13}$, $R_{16}$, $R_{17}$, $R_{18}$ and $R_{19}$ are each independently of the other hydrogen, $C_1$–$C_{18}$-alkyl, $C_1$–$C_4$-alkoxy, halogen or trifluoromethyl, and E stands for hydrogen or for B, with the provisos that at least one E stands for B and at least one E in formula XII stands for H.

14. A composition according to claim 8, wherein the compound of formula I is an indigo derivative of formula

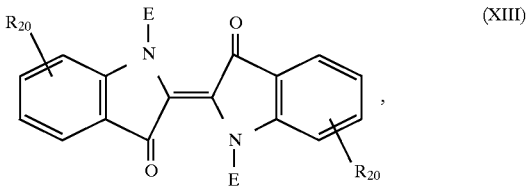
(XIII)

wherein $R_{20}$ is hydrogen, CN, $C_1$–$C_4$-alkyl, $C_1$–$C_4$-alkoxy or halogen, and E stands for hydrogen or for B, with the proviso that at least one E stands for B.

15. A composition according to claim 8, wherein the compound of formula I is a benzimidazolone-azocompound of formula

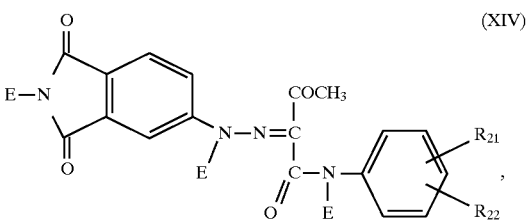
(XIV)

wherein $R_{21}$ and $R_{22}$ are each independently of the other hydrogen, halogen, $C_1$–$C_4$-alkyl or $C_1$–$C_4$-alkoxy, and E stands for hydrogen or for B, with the proviso that at least one E stands for B.

16. A composition according to claim 8, wherein the compound of formula I is an anthraquinoide compound of formula

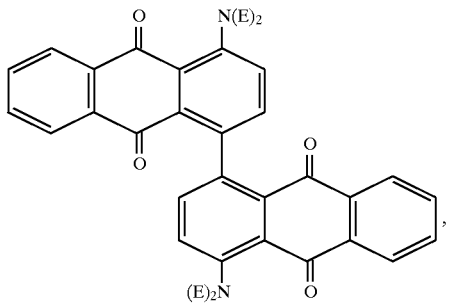 (XV)

wherein E stands for hydrogen or for B, with the proviso that at least one E stands for B.

17. A composition according to claim 8, wherein the compound of formula I is a phthalocyanine of formula

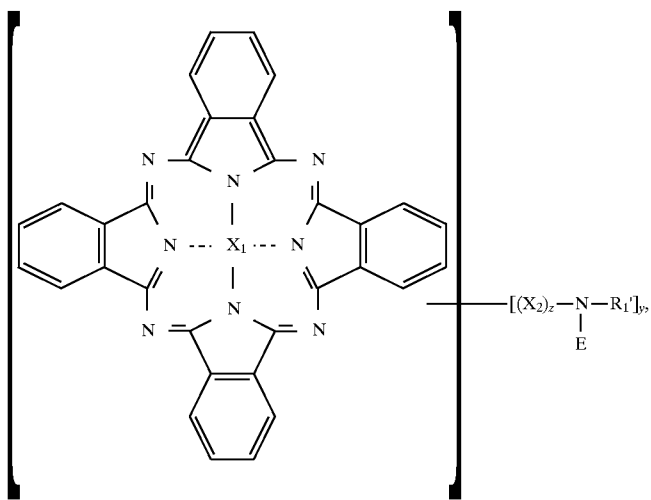

(XVI)

wherein $X_1$ is $H_2$, Zn, Cu, Ni, Fe or V, $X_2$ is —CH($R_2'$)— or —SO$_2$—, $R_1'$ is hydrogen, $C_1$–$C_4$-alkyl, —N(E)$R_2'$, —NHCOR$_3'$, —COR$_3'$ or

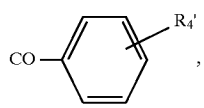

$R_2'$ is hydrogen or $C_1$–$C_4$-alkyl, $R_3'$ is $C_1$–$C_4$-alkyl, $R_4'$ is hydrogen, halogen, $C_1$–$C_4$-alkyl or $C_1$–$C_4$-alkoxy, z is zero or 1 and y is an integer of 1–4, and E stands for hydrogen or for B, with the proviso that at least one E stands for B.

18. A composition according to claim 8, wherein the compound of formula I is a pyrrolo[3,4-c]pyrrole of formula

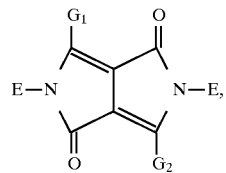 (XVII)

wherein $G_1$ and $G_2$ are each independently of the other a group of formula

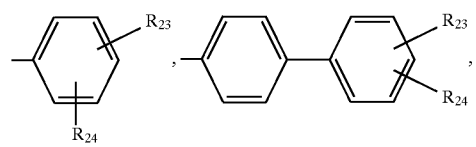

-continued

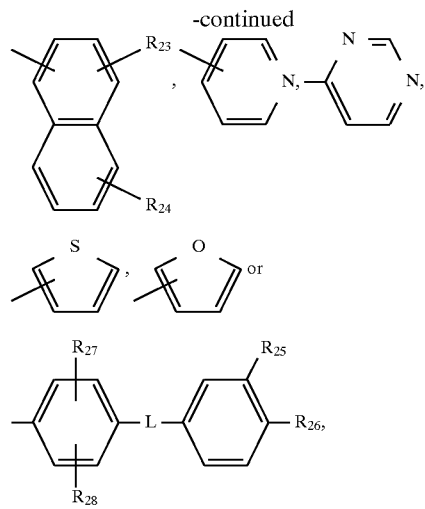

$R_{23}$ and $R_{24}$ are each independently of the other hydrogen, halogen, $C_1$–$C_{18}$-alkyl, $C_1$–$C_{18}$-alkoxy, $C_1$–$C_{18}$-alkylmercapto, $C_1$–$C_{18}$-alkylamino, —CN, —NO$_2$, phenyl, trifluoromethyl, $C_5$–$C_6$-cycloalkyl, —C=N—($C_1$–$C_{18}$-alyl),

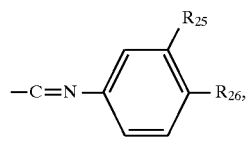

imidazolyl, pyrazolyl, triazolyl, piperazinyl, pyrrolyl, oxazolyl, benzoxazolyl, benzthiazolyl, benzimidazolyl, morpholinyl, piperadinyl or pyrrolidinyl, L is —CH$_2$—, —CH(CH$_3$)—, —C(CH$_3$)$_2$—, —CH=N—, —N=N—, —O—, —S—, —SO—, —SO$_2$— or —NR$_{29}$, R$_{25}$ and R$_{26}$ are each independently of the other hydrogen, halogen, C$_1$–C$_6$-alkyl, C$_1$–C$_{18}$-alkoxy or —CN, R$_{27}$ and R$_{28}$ are each independently of the other hydrogen, halogen or C$_1$–C$_6$-alkyl, R$_{29}$ is hydrogen or C$_1$–C$_6$-alkyl, and E stands for hydrogen or for B, with the proviso that at least one E stands for B.

19. A composition according to claim 8, wherein the compound of formula I is one selected under those of formulae

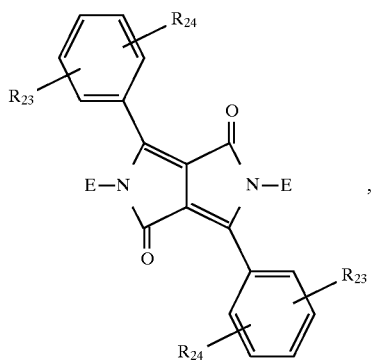

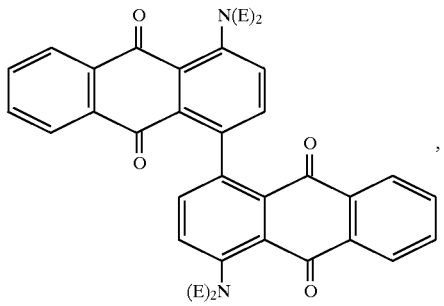

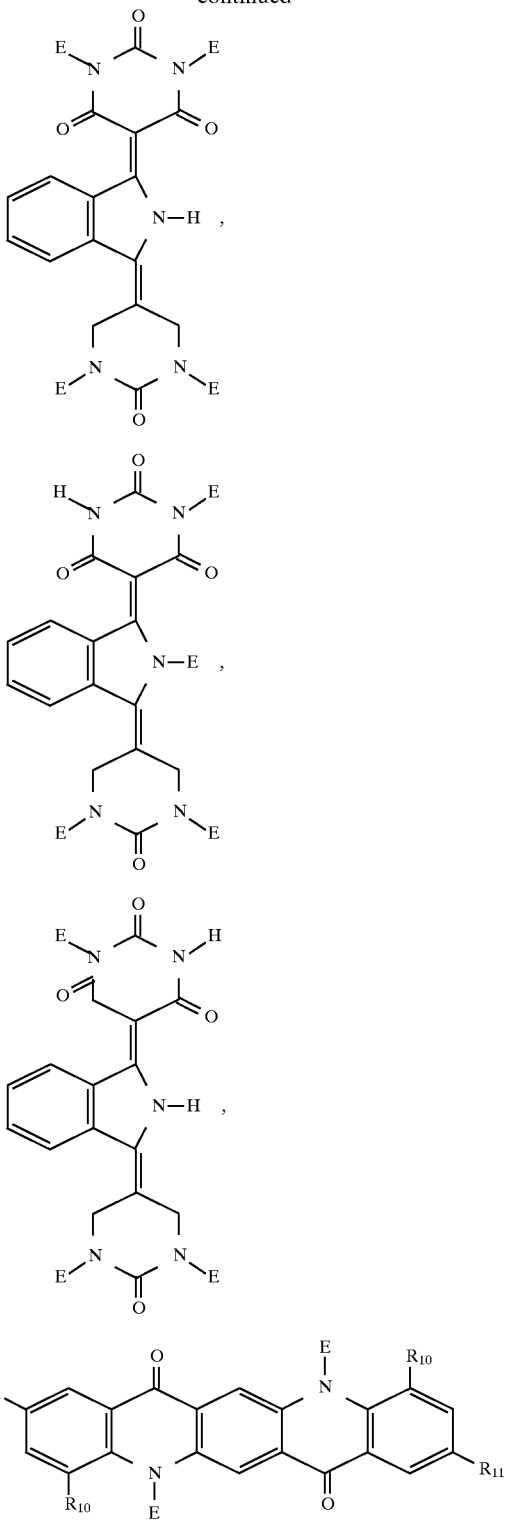

or mixtures thereof, where E is —C(=O)—O—C(CH$_3$)$_3$, and where R$_{10}$ and R$_{11}$ are each independently of the other hydrogen, halogen, C$_1$–C$_5$-alkyl or C$_1$–C$_4$-alkoxy, and where R$_{23}$ and R24 are hydrogen, halogen, C$_1$–C$_5$-alkyl, C$_1$–C$_4$-alkoxy, phenyl or cyano.

20. A composition according to claim 8, wherein x is 1 or 2 and B is a group of formula

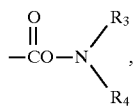 (IV)

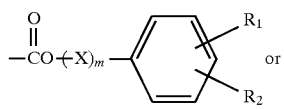

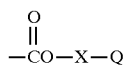 (VI)

and, if x is 2, one of the B residues may also be hydrogen, wherein in formulae IV, V and VI, m is 0 or 1, X is C$_1$–C$_4$-alkylene or C$_2$–C$_5$-alkenylene, R$_1$ and R$_2$ are each independently of the other hydrogen, C$_1$–C$_4$-alkyl, methoxy, chloro or NO$_2$, and Q is hydrogen, CN, CCl$_3$, a group

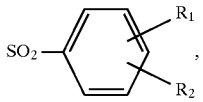

SO$_2$ CH$_3$ or SCH$_3$, and

R$_3$ and R$_4$ in formula IV are each independently of the other hydrogen, C$_1$–C$_4$-alkyl or a group

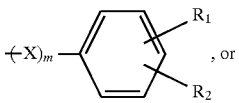, or

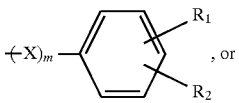

R$_3$ and R$_4$ together form a piperidinyl residue with the nitrogen atom they are attached to.

21. A composition according to claim 1, which in addition to components (a) and (b), also comprises a solvent.

22. A composition according to claim 1, wherein said component (b) is selected from the group consisting of diazoquinone resists, dichromated polymers, polymers having crosslinking groups in side chains, bis azide resists based on poly(cis-isoprene) and bis-azides, water processable azido resists; compositions comprising photopolymers and reactive binders selected from the group consisting of unsaturated polymers obtained by the condensation of maleic and fumaric acid with glycols, polyfunctional acrylates and olyfunctional prepolymers having acrylic functional groups in side chains; poly(tert-butoxycarbonyloxystyrene) with an onium salt acid generator, bis-azide-cyclized rubber compositions containing 4,4'-diazidodiphenyl sulfide, bis-azide-poly(vinyl phenol) compositions containing 3,3'-diazidodiphenyl sulfone, poly(p-hydroxystyrene) or novolacs with melamine crosslinker together with acid catalysts, esters of poly(vinyl benzoic acid), poly(acrylic acid) and poly(methacrylic acid) having releasable groups which groups are released by heating in the presence of catalytic acid, and blocked poly-p-hydroxystyrenes.

* * * * *